(12) United States Patent
Blouin et al.

(10) Patent No.: US 9,212,260 B2
(45) Date of Patent: Dec. 15, 2015

(54) POLYMERS OF 8,9-DIHYDROBENZO[DEF]CARBAZOLE AND THEIR USE AS ORGANIC SEMICONDUCTORS

(75) Inventors: Nicolas Blouin, Southampton (GB); William Mitchell, Chandler's Ford (GB); Changsheng Wang, Durham (GB); Steven Tierney, Southampton (GB)

(73) Assignee: MERCK PATENT GMBH, Darmstadt (DE)

( * ) Notice: Subject to any disclaimer, the term of this patent is extended or adjusted under 35 U.S.C. 154(b) by 356 days.

(21) Appl. No.: 13/635,998

(22) PCT Filed: Feb. 25, 2011

(86) PCT No.: PCT/EP2011/000945
§ 371 (c)(1),
(2), (4) Date: Sep. 19, 2012

(87) PCT Pub. No.: WO2011/116866
PCT Pub. Date: Sep. 29, 2011

(65) Prior Publication Data
US 2013/0001476 A1  Jan. 3, 2013

(30) Foreign Application Priority Data
Mar. 24, 2010 (EP) ..................................... 10003115

(51) Int. Cl.
| | | |
|---|---|---|
| C08G 73/06 | (2006.01) | |
| C08G 61/12 | (2006.01) | |
| H01L 51/54 | (2006.01) | |
| H01L 51/56 | (2006.01) | |
| H01L 51/46 | (2006.01) | |
| H01L 51/48 | (2006.01) | |
| H01L 51/00 | (2006.01) | |
| H01L 51/42 | (2006.01) | |

(52) U.S. Cl.
CPC .......... C08G 73/0688 (2013.01); C08G 61/123 (2013.01); C08G 61/124 (2013.01); C08G 61/126 (2013.01); H01L 51/0043 (2013.01); C08G 2261/3223 (2013.01); C08G 2261/3246 (2013.01); C08G 2261/344 (2013.01); C08G 2261/364 (2013.01); C08G 2261/91 (2013.01); H01L 51/0036 (2013.01); H01L 51/0037 (2013.01); H01L 51/4253 (2013.01); Y02E 10/549 (2013.01)

(58) Field of Classification Search
CPC ............ C08G 73/0688; C08G 61/123; C08G 61/124; C08G 61/126; C08G 2261/3224; C08G 2261/3246; C08G 2261/344; C08G 2261/364; C08G 2261/91; H01L 51/0043; H01L 51/0036; H01L 51/0037; H01L 51/4253; Y02E 10/549
See application file for complete search history.

(56) References Cited

U.S. PATENT DOCUMENTS

| | | | |
|---|---|---|---|
| 6,353,083 B1 | 3/2002 | Inbasekaran et al. | |
| 7,217,824 B2 | 5/2007 | Zhang | |
| 7,309,532 B2 * | 12/2007 | Kim et al. ..................... | 428/690 |
| 7,396,852 B2 | 7/2008 | Li et al. | |
| 7,528,261 B2 | 5/2009 | Li et al. | |
| 8,673,959 B2 | 3/2014 | Li et al. | |
| 2007/0112172 A1 | 5/2007 | Li et al. | |
| 2008/0103314 A1 | 5/2008 | Li et al. | |
| 2008/0207917 A1 | 8/2008 | Li et al. | |
| 2011/0060097 A1 | 3/2011 | Wang | |
| 2012/0138865 A1 | 6/2012 | Blouin et al. | |
| 2014/0148567 A1 | 5/2014 | Li | |

FOREIGN PATENT DOCUMENTS

| | | |
|---|---|---|
| CN | 1896074 A | 1/2007 |
| CN | 101 885 834 | 11/2010 |
| CN | 101 891 670 | 11/2010 |
| CN | 101885834 | * 11/2010 |
| WO | WO-00 46321 | 8/2000 |
| WO | WO-2011 018144 | 2/2011 |

OTHER PUBLICATIONS

Cox et al. Metalation reactions. III. Nuclear Magnetic resonance Study of the Metalaltion of 4,5-methylene and 4,5-iminophenanthrenes. Journal of the American Chemical Society, 90:21, Oct. 9, 1968, pp. 5906-5909.*
Office Action in related Japanese Patent Application No. 2013-500358 dated Jul. 1, 2014.
Cantrall, E. W. et al., "1,11-Iminoestrones. II. Some derivatives and reactions," Journal of Organic Chemistry, 1967, vol. 32, No. 12, pp. 4081-4084.
Office Action for related Chinese Patent Application No. 201180014640.2 dated Jul. 2, 2014.
Wei, C. et al., "Study to the synthesis and properties of benzoselenediazole-containing polycarbazole and fluorene conjugated polyelectrolye and precursors thereof," High-Molecular Transaction, Jun. 30, 2007; vol. 6, pp. 566-572.
Cox, R. H. et al., "Metalation reactions. III. Nuclear magnetic resonance study of the metalation of 4,5-methylene- and 4,5-iminophenanthrenes," Journal of the American Chemical Soceity, Oct. 9, 1968, vol. 90, No. 21, pp. 5906-5909.
English Abstract of CN1896074, Publication Date: Jan. 17, 2007.
International Search Report for PCT/EP2011/000945 dated Jul. 26, 2011.
Qin, R. et al., "A planar Copolymer for High Efficiency Polymer Solar Cells," JACS, 2009, vol. 131, pp. 14612-14613.
Univ South China Tech, "4, 5-ethylene-2. 7-disubstituted carbazole and preparation method thereof," Espacenet, Publication Date: Nov. 24, 2010; English Abstract of CN-101 891 670.
Univ South China Tech, "Conjugated polymer containing 4, 5-ethylene-2,7-carbazole as well as preparation method and application thereof," Espacenet, Publication Date: Nov. 17, 2010; English Abstract of CN-101 885 834.

* cited by examiner

*Primary Examiner* — Amina Khan
(74) *Attorney, Agent, or Firm* — Millen, White, Zelano and Branigan, P.C.

(57) ABSTRACT

The invention relates to novel polymers containing 8,9-dihydrobenzo[def]carbazole units, methods and materials for their preparation, their use as semiconductors in organic electronic (OE) devices, and to OE devices comprising these polymers.

20 Claims, 1 Drawing Sheet

POLYMERS OF 8,9-DIHYDROBENZO[DEF]CARBAZOLE AND THEIR USE AS ORGANIC SEMICONDUCTORS

FIELD OF THE INVENTION

The invention relates to novel polymers containing 8,9-dihydrobenzo[def]carbazole units, methods and materials for their preparation, their use as semiconductors in organic electronic (OE) devices, and to OE devices comprising these polymers.

BACKGROUND OF THE INVENTION

In recent years, there has been development of organic semiconducting (OSC) materials in order to produce more versatile, lower cost electronic devices. Such materials find application in a wide range of devices or apparatus, including organic field effect transistors (OFETs), organic light emitting diodes (OLEDs), photodetectors, organic photovoltaic (OPV) cells, sensors, memory elements and logic circuits to name just a few. The organic semiconducting materials are typically present in the electronic device in the form of a thin layer, for example less than 1 micron thick.

The performance of OFET devices is principally based upon the charge carrier mobility of the semiconducting material and the current on/off ratio, so the ideal semiconductor should have a low conductivity in the off state, combined with a high charge carrier mobility ($>1\times10^{-3}$ cm$^2$ V$^{-1}$ s$^{-1}$). In addition, it is important that the semiconducting material is relatively stable to oxidation i.e. it has a high ionisation potential, as oxidation leads to reduced device performance.

For application in bulk heterojunction (BHJ) organic photovoltaic (OPV) cells, a semiconductor is required that has a low band-gap to enable improved light harvesting by the photoactive layer that can lead to higher cell efficiencies.

Further requirements for the semiconductor are good solution processability, especially for large-scale production of thin layers and desired patterns, and high stability, film uniformity and integrity of the organic semiconductor layer.

Nitrogen containing small molecules, oligomers and polymers have demonstrated interesting hole transport properties.[1-5] Various materials have been developed to take advantage of this physical property in organic light emitting devices (OLED), in organic field-effect transistors (OFET) and organic photovoltaic cells (OPV). However, most of those materials show poor solubility or poor structural organization in the solid state.[1-5] Furthermore, these materials have generally required complex synthetic routes to yield the final material.

Recently materials were reported that combine fluorene and phenanthrene core units, leading to highly thermally stable polymers derivatives, namely poly(4H-cyclopenta[def]phenanthrene), for use in OLED and OPV devices.[6-8] However these materials are reported to show a low performance due to their low charge transport properties.

Therefore, there is still a need for OSC materials that do not have the drawbacks of prior art materials and are suitable for use in OFET and BHJ OPV devices.

The materials should be easy to synthesize, show good structural organization and film-forming properties, exhibit good electronic properties, especially a high charge carrier mobility, good solution processibilty i.e. a high solubility in organic solvents, and high stability in air. For use in OPV cells, they should have a low band-gap, which enables improved light harvesting by the photoactive layer and can lead to higher cell efficiencies. For use in OFETs there is also a need for OSC materials that allow improved charge injection into the semiconducting layer from the source-drain electrodes.

It was an aim of the present invention to provide improved polymers for use as OSC materials especially in BHJ OPV devices, but also in OFET devices, which show the above-mentioned advantageous properties, and which do not show the above-mentioned disadvantages of prior art materials. Another aim of the invention was to extend the pool of OSC materials available to the expert. Other aims of the present invention are immediately evident to the expert from the following detailed description.

The inventors of the present invention have found that these aims can be achieved by providing the copolymers as described hereinafter, which contain optionally substituted 8,9-dihydrobenzo[def]carbazole units.

The 8,9-dihydrobenzo[def]carbazole unit has not been yet integrated into oligomeric or polymeric structure. Polymers containing this unit are expected to show improved hole transport and photovoltaic properties, compared e.g. to the already known poly(4H-cyclopenta[def]phenanthrenes). It is believed that the additional nitrogen atom in the structure has an influence on this improved behaviour by increasing the electron density within the unit.

SUMMARY OF THE INVENTION

The invention relates to conjugated polymers of formula I

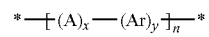

wherein
A is on each occurrence identically or differently a group of formula II

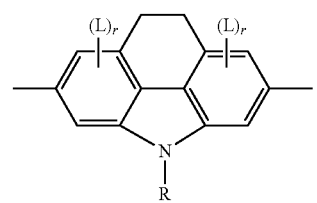

R is on each occurrence identically or differently H, halogen, a straight-chain, branched or cyclic alkyl with 1 to 35 C atoms, in which one or more non-adjacent C atoms are optionally replaced by —O—, —S—, —CO—, —CO—O—, —O—CO—, —O—CO—O—, —CR$^0$=CR$^{00}$— or —C≡C— and in which one or more H atoms are optionally replaced by F, Cl, Br, I or CN, or R is an aryl, heteroaryl, aryloxy or heteroaryloxy group having 2 to 40 C atoms, and R is optionally substituted by one or more non-aromatic groups R$^1$, R$^0$ and R$^{00}$ are independently of each other H or an optionally substituted carbyl or hydrocarbyl group optionally comprising one or more hetero atoms, Ar is on each occurrence identically or differently —CY$^1$=CY$^2$—, —C≡C— or an aryl or heteroaryl group that is optionally substituted by one or more groups R or R$^1$, $Y^1$ and $Y^2$ are independently of each other H, F, Cl or CN, $R^1$ is on each occurrence identically or differently H, halogen, —CN, —NC, —NCO, —NCS, —OCN, —SCN, —C(=O)NR$^0$R$^{00}$, —C(=O)X$^0$, —C(=O)R$^0$, —NH$_2$, —NR$^0$R$^{00}$, —SH, —SR$^0$, —SO$_3$H, —SO$_2$R$^0$, —OH, —NO$_2$, —CF$_3$, —SF$_5$, optionally substituted silyl, carbyl or hydrocarbyl with 1 to 40 C atoms that is optionally substituted and optionally comprises one or more hetero atoms, or P-Sp-, P is a polymerisable group, Sp is a spacer group or a single bond, $X^0$ is halogen, L has on each occurrence identically or differently one of the meanings given for R or $R^1$, r is 0, 1 or 2, x is on each occurrence identically or differently 0 or 1, wherein in at least one repeating unit [(A)$_x$-(Ar)$_y$]x is 1, y is on each occurrence identically or differently 0 or 1, n is an integer >1.

The invention further relates to a polymer blend comprising one or more polymers according to the present invention and one or more polymers, preferably selected from polymers having semiconducting, charge transport, hole/electron transport, hole/electron blocking, electrically conducting, photoconducting or light emitting properties.

The invention further relates to a formulation comprising one or more polymers or polymer blends according to the present invention and one or more solvents, preferably selected from organic solvents.

The invention further relates to the use of polymers, polymer blends and formulations according to the present invention as charge transport, semiconducting, electrically conducting, photoconducting or light emitting material in optical, electrooptical, electronic, electroluminescent or photoluminescent components or devices.

The invention further relates to a charge transport, semiconducting, electrically conducting, photoconducting or light emitting material or component comprising one or more polymers, polymer blends of formulations according to the present invention.

The invention further relates to an optical, electrooptical or electronic component or device comprising one or more polymers, polymer blends, formulations, components or materials according to the present invention.

The optical, electrooptical, electronic electroluminescent and photoluminescent components or devices include, without limitation, organic field effect transistors (OFET), thin film transistors (TFT), integrated circuits (IC), logic circuits, capacitors, radio frequency identification (RFID) tags, devices or components, organic light emitting diodes (OLED), organic light emitting transistors (OLET), flat panel displays, backlights of displays, organic photovoltaic devices (OPV), bulk heterojunction (BHJ) OPV devices, solar cells, laser diodes, photoconductors, photodetectors, electrophotographic devices, electrophotographic recording devices, organic memory devices, sensor devices, charge injection layers, charge transport layers or interlayers in polymer light emitting diodes (PLEDs), organic plasmon-emitting diodes (OPEDs), Schottky diodes, planarising layers, antistatic films, polymer electrolyte membranes (PEM), conducting substrates, conducting patterns, electrode materials in batteries, alignment layers, biosensors, biochips, security markings, security devices, and components or devices for detecting and discriminating DNA sequences.

DETAILED DESCRIPTION OF THE INVENTION

Figure 1:
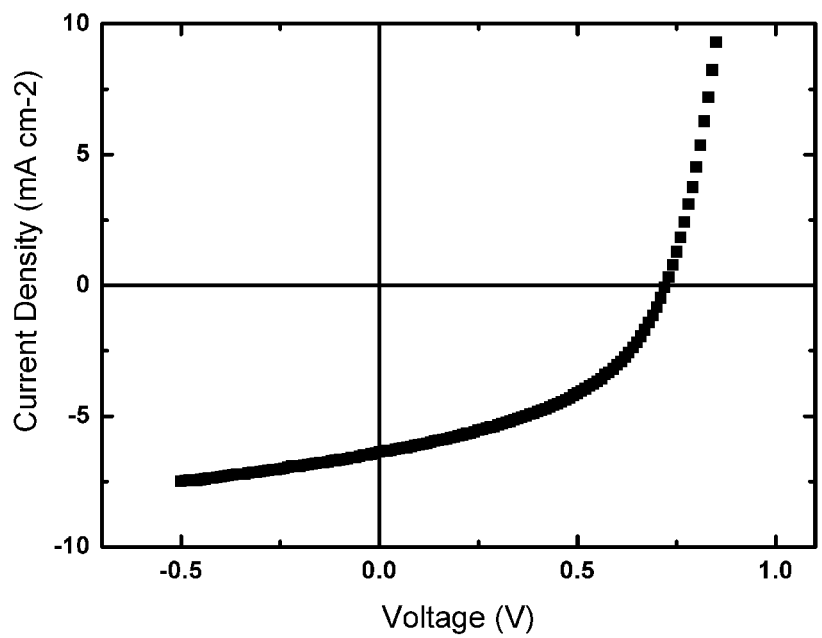
FIG. 1 shows the current density versus voltage of a bulk heterojunction OPV device according to Example 3.

The monomers and polymers of the present invention are easy to synthesize and exhibit several advantageous properties, like a low bandgap, a high charge carrier mobility, a high solubility in organic solvents, a good processability for the device manufacture process, a high oxidative stability and a long lifetime in electronic devices. In addition, they show the following advantageous properties:

i) The HOMO energy level of the poly-2,6-(9,10-dihydrobenzo[def]carbazole) is expected to be significantly lower than in case of the poly(3-hexylthiophene) (P3HT) which should lead to air stable polymers. Furthermore, a higher open circuit potential ($V_{oc}$) can be obtained in an OPV bulk-heterojunction device versus a device containing poly(3-hexylthiophene) (P3HT).

ii) The R site offers easy multiple substitution of the monomer unit. Fine tuning of the R group enables to improve the solubility of the polymeric material in common organic solvents and allows the material to be easily solution processed. The addition of the alkyl or and alkoxy side groups can also promote the material to exhibit better pi-pi-stacking and thus form highly microstructurally organized films after deposition from solution.[1,9,10]

iii) The nitrogen atom increases the electron density within the unit and is expected to improve the charge transport behaviour of the new material, leading to good charge motilities in a OFET device and power conversion efficiency in OPV device.

iii) The addition of reactive functionality onto specific positions on the benzo[def]carbazole core will enable the preparation of regioregular chemically polymerized homopolymers and copolymers. Such polymers can be obtained using Yamamoto,[11,12] Suzuki[13] or Stille[14] coupling polymerization methods. By these preparative methods, the regioregular polymer will have higher structural order in the solid state compared to regioirregular materials synthesized using a non-selective polymerization method. This will lead to a polymer with higher charge carrier mobility for application in OFET and OPV devices.

iv) It has been shown that the optical properties of conjugated polymers can be modulated by the generation of a donor-acceptor copolymer structure.[15] As an electron rich unit, the 8,9-dihydrobenzo[def]carbazole unit is a good donor comonomer, which is ideal for such donor-acceptor polymer structures. This can lead to low band-gap polymers for OPV applications[16] or green, yellow and red fluorescing polymers for OLED applications.

The term "polymer" generally means a molecule of high relative molecular mass, the structure of which essentially comprises the multiple repetition of units derived, actually or conceptually, from molecules of low relative molecular mass (PAC, 1996, 68, 2291). The term "oligomer" generally means a molecule of intermediate relative molecular mass, the structure of which essentially comprises a small plurality of units derived, actually or conceptually, from molecules of lower relative molecular mass (PAC, 1996, 68, 2291). In a preferred sense according to the present invention a polymer means a compound having >1, preferably ≥5 repeating units, and an oligomer means a compound with >1 and <10, preferably <5, repeating units.

The terms "repeating unit" and "monomeric unit" mean the constitutional repeating unit (CRU), which is the smallest constitutional unit the repetition of which constitutes a regular macromolecule, a regular oligomer molecule, a regular block or a regular chain (PAC, 1996, 68, 2291).

The term "leaving group" means an atom or group (charged or uncharged) that becomes detached from an atom in what is considered to be the residual or main part of the molecule taking part in a specified reaction (see also PAC, 1994, 66, 1134).

The term "conjugated" means a compound containing mainly C atoms with sp²-hybridisation (or optionally also sp-hybridisation), which may also be replaced by hetero atoms. In the simplest case this is for example a compound with alternating C—C single and double (or triple) bonds, but does also include compounds with units like 1,3-phenylene. "Mainly" means in this connection that a compound with naturally (spontaneously) occurring defects, which may lead to interruption of the conjugation, is still regarded as a conjugated compound.

Unless stated otherwise, the molecular weight is given as the number average molecular weight $M_n$ or weight average molecular weight $M_w$, which is determined by gel permeation chromatography (GPC) against polystyrene standards in eluent solvents such as tetrahydrofuran, trichloromethane (TCM, chloroform), chlorobenzene or 1,2,4-trichloro-benzene. Unless stated otherwise, trichloromethane is used as solvent. The degree of polymerization, also referred to as total number of repeating units, n, means the number average degree of polymerization given as $n=M_n/M_u$, wherein $M_n$ is the number average molecular weight and $M_U$ is the molecular weight of the single repeating unit, see J. M. G. Cowie, *Polymers: Chemistry & Physics of Modern Materials*, Blackie, Glasgow, 1991.

The term "carbyl group" as used above and below denotes any monovalent or multivalent organic radical moiety which comprises at least one carbon atom either without any non-carbon atoms (like for example —C≡C—), or optionally combined with at least one non-carbon atom such as N, O, S, P, Si, Se, As, Te or Ge (for example carbonyl etc.). The term "hydrocarbyl group" denotes a carbyl group that does additionally contain one or more H atoms and optionally contains one or more hetero atoms like for example N, O, S, P, Si, Se, As, Te or Ge.

A carbyl or hydrocarbyl group comprising a chain of 3 or more C atoms may also be straight-chain, branched and/or cyclic, including spiro and/or fused rings.

Preferred carbyl and hydrocarbyl groups include alkyl, alkoxy, alkylcarbonyl, alkoxycarbonyl, alkylcarbonyloxy and alkoxycarbonyloxy, each of which is optionally substituted and has 1 to 40, preferably 1 to 25, very preferably 1 to 18 C atoms, furthermore optionally substituted aryl or aryloxy having 6 to 40, preferably 6 to 25 C atoms, furthermore alkylaryloxy, arylcarbonyl, aryloxycarbonyl, arylcarbonyloxy and aryloxycarbonyloxy, each of which is optionally substituted and has 6 to 40, preferably 7 to 40 C atoms, wherein all these groups do optionally contain one or more hetero atoms, preferably selected from N, O, S, P, Si, Se, As, Te and Ge.

The carbyl or hydrocarbyl group may be a saturated or unsaturated acyclic group, or a saturated or unsaturated cyclic group. Unsaturated acyclic or cyclic groups are preferred, especially aryl, alkenyl and alkynyl groups (especially ethynyl). Where the $C_1$-$C_{40}$ carbyl or hydrocarbyl group is acyclic, the group may be straight-chain or branched. The $C_1$-$C_{40}$ carbyl or hydrocarbyl group includes for example: a $C_1$-$C_{40}$ alkyl group, a $C_1$-$C_{40}$ alkoxy or oxaalkyl group, a $C_2$-$C_{40}$ alkenyl group, a $C_2$-$C_{40}$ alkynyl group, a $C_3$-$C_{40}$ allyl group, a $C_4$-$C_{40}$ alkyldienyl group, a $C_4$-$C_{40}$ polyenyl group, a $C_6$-$C_{18}$ aryl group, a $C_6$-$C_{40}$ alkylaryl group, a $C_6$-$C_{40}$ arylalkyl group, a $C_4$-$C_{40}$ cycloalkyl group, a $C_4$-$C_{40}$ cycloalkenyl group, and the like. Preferred among the foregoing groups are a $C_1$-$C_{20}$ alkyl group, a $C_2$-$C_{20}$ alkenyl group, a $C_2$-$C_{20}$ alkynyl group, a $C_3$-$C_{20}$ allyl group, a $C_4$-$C_{20}$ alkyldienyl group, a $C_6$-$C_{12}$ aryl group and a $C_4$-$C_{20}$ polyenyl group, respectively. Also included are combinations of groups having carbon atoms and groups having hetero atoms, like e.g. an alkynyl group, preferably ethynyl, that is substituted with a silyl group, preferably a trialkylsilyl group.

Aryl and heteroaryl preferably denote a mono-, bi- or tri-cyclic aromatic or heteroaromatic group with up to 25 C atoms that may also comprise condensed rings and is optionally substituted with one or more groups L as defined above.

Very preferred substituents L are selected from halogen, most preferably F, or alkyl, alkoxy, oxaalkyl, thioalkyl, fluoroalkyl and fluoroalkoxy with 1 to 12 C atoms or alkenyl, alkynyl with 2 to 12 C atoms.

Especially preferred aryl and heteroaryl groups are phenyl in which, in addition, one or more CH groups may be replaced by N, naphthalene, thiophene, selenophene, thienothiophene, dithienothiophene, fluorene and oxazole, all of which can be unsubstituted, mono- or polysubstituted with L as defined above. Very preferred rings are selected from pyrrole, preferably N-pyrrole, pyridine, preferably 2- or 3-pyridine, pyrimidine, thiophene preferably 2-thiophene, selenophene, preferably 2-selenophene, thieno[3,2-b]thiophene, thiazole, thiadiazole, oxazole and oxadiazole, especially preferably thiophene-2-yl, 5-substituted thiophene-2-yl or pyridine-3-yl, all of which can be unsubstituted, mono- or polysubstituted with L as defined above.

An alkyl or alkoxy radical, i.e. where the terminal $CH_2$ group is replaced by —O—, can be straight-chain or branched. It is preferably straight-chain, has 2, 3, 4, 5, 6, 7 or 8 carbon atoms and accordingly is preferably ethyl, propyl, butyl, pentyl, hexyl, heptyl, octyl, ethoxy, propoxy, butoxy, pentoxy, hexoxy, heptoxy, or octoxy, furthermore methyl, nonyl, decyl, undecyl, dodecyl, tridecyl, tetradecyl, pentadecyl, nonoxy, decoxy, undecoxy, dodecoxy, tridecoxy or tetradecoxy, for example.

An alkenyl group, wherein one or more $CH_2$ groups are replaced by —CH=CH— can be straight-chain or branched. It is preferably straight-chain, has 2 to 10 C atoms and accordingly is preferably vinyl, prop-1-, or prop-2-enyl, but-1-, 2- or but-3-enyl, pent-1-, 2-, 3- or pent-4-enyl, hex-1-, 2-, 3-, 4- or hex-5-enyl, hept-1-, 2-, 3-, 4-, 5- or hept-6-enyl, oct-1-, 2-, 3-, 4-, 5-, 6- or oct-7-enyl, non-1-, 2-, 3-, 4-, 5-, 6-, 7- or non-8-enyl, dec-1-, 2-, 3-, 4-, 5-, 6-, 7-, 8- or dec-9-enyl.

Especially preferred alkenyl groups are $C_2$-$C_7$-1E-alkenyl, $C_4$-$C_7$-3E-alkenyl, $C_5$-$C_7$-4-alkenyl, $C_6$-$C_7$-5-alkenyl and $C_7$-6-alkenyl, in particular $C_2$-$C_7$-1E-alkenyl, $C_4$-$C_7$-3E-alkenyl and $C_5$-$C_7$-4-alkenyl. Examples for particularly preferred alkenyl groups are vinyl, 1E-propenyl, 1E-butenyl, 1E-pentenyl, 1E-hexenyl, 1E-heptenyl, 3-butenyl, 3E-pentenyl, 3E-hexenyl, 3E-heptenyl, 4-pentenyl, 4Z-hexenyl, 4E-hexenyl, 4Z-heptenyl, 5-hexenyl, 6-heptenyl and the like. Groups having up to 5 C atoms are generally preferred.

An oxaalkyl group, i.e. where one $CH_2$ group is replaced by —O—, is preferably straight-chain 2-oxapropyl (=methoxymethyl), 2-(=ethoxymethyl) or 3-oxabutyl (=2-methoxyethyl), 2-, 3-, or 4-oxapentyl, 2-, 3-, 4-, or 5-oxahexyl, 2-, 3-, 4-, 5-, or 6-oxaheptyl, 2-, 3-, 4-, 5-, 6- or 7-oxaoctyl, 2-, 3-, 4-, 5-, 6-, 7- or 8-oxanonyl or 2-, 3-, 4-, 5-, 6-,7-, 8- or 9-oxadecyl, for example. Oxaalkyl, i.e. where one $CH_2$ group is replaced by —O—, is preferably straight-chain 2-oxapropyl (=methoxymethyl), 2-(=ethoxymethyl) or 3-oxabutyl (=2-methoxyethyl), 2-, 3-, or 4-oxapentyl, 2-, 3-, 4-, or 5-oxahexyl, 2-, 3-, 4-, 5-, 6- or 7-oxaoctyl, 2-, 3-, 4-, 5-, 6-, 7- or 8-oxanonyl or 2-, 3-, 4-, 5-, 6-,7-, 8- or 9-oxadecyl, for example.

In an alkyl group wherein one $CH_2$ group is replaced by —O— and one by —CO—, these radicals are preferably neighboured. Accordingly these radicals together form a carbonyloxy group —CO—O— or an oxycarbonyl group —O—CO—. Preferably this group is straight-chain and has 2 to 6 C atoms. It is accordingly preferably acetyloxy, propionyloxy, butyryloxy, pentanoyloxy, hexanoyloxy, acetyloxymethyl, propionyloxymethyl, butyryloxymethyl, pentanoyloxymethyl, 2-acetyloxyethyl, 2-propionyloxy-ethyl, 2-butyryloxyethyl, 3-acetyloxypropyl, 3-propionyloxypropyl, 4-acetyloxybutyl, methoxycarbonyl, ethoxycarbonyl, propoxycarbonyl, butoxycarbonyl, pentoxycarbonyl, methoxycarbonylmethyl, ethoxy-carbonylmethyl, propoxycarbonylmethyl, butoxycarbonylmethyl, 2-(methoxycarbonyl)ethyl, 2-(ethoxycarbonyl)ethyl, 2-(propoxy-carbonyl)ethyl, 3-(methoxycarbonyl)propyl, 3-(ethoxycarbonyl)propyl, 4-(methoxycarbonyl)-butyl.

An alkyl group wherein two or more $CH_2$ groups are replaced by —O— and/or —COO— can be straight-chain or branched. It is preferably straight-chain and has 3 to 12 C atoms. Accordingly it is preferably bis-carboxy-methyl, 2,2-bis-carboxy-ethyl, 3,3-bis-carboxy-propyl, 4,4-bis-carboxy-butyl, 5,5-bis-carboxy-pentyl, 6,6-bis-carboxy-hexyl, 7,7-bis-carboxy-heptyl, 8,8-bis-carboxy-octyl, 9,9-bis-carboxy-nonyl, 10,10-bis-carboxy-decyl, bis-(methoxycarbonyl)-methyl, 2,2-bis-(methoxycarbonyl)-ethyl, 3,3-bis-(methoxycarbonyl)-propyl, 4,4-bis-(methoxycarbonyl)-butyl, 5,5-bis-(methoxycarbonyl)-pentyl, 6,6-bis-(methoxycarbonyl)-hexyl, 7,7-bis-(methoxycarbonyl)-heptyl, 8,8-bis-(methoxycarbonyl)-octyl, bis-(ethoxycarbonyl)-methyl, 2,2-bis-(ethoxycarbonyl)-ethyl, 3,3-bis-(ethoxycarbonyl)-propyl, 4,4-bis-(ethoxycarbonyl)-butyl, 5,5-bis-(ethoxycarbonyl)-hexyl.

A thioalkyl group, i.e where one $CH_2$ group is replaced by —S—, is preferably straight-chain thiomethyl (—$SCH_3$), 1-thioethyl (—$SCH_2CH_3$), 1-thiopropyl (=—$SCH_2CH_2CH_3$), 1-(thiobutyl), 1-(thiopentyl), 1-(thiohexyl), 1-(thioheptyl), 1-(thiooctyl), 1-(thiononyl), 1-(thiodecyl), 1-(thioundecyl) or 1-(thiododecyl), wherein preferably the $CH_2$ group adjacent to the $sp^2$ hybridised vinyl carbon atom is replaced.

A fluoroalkyl group is preferably straight-chain perfluoroalkyl $C_iF_{2i+1}$, wherein i is an integer from 1 to 15, in particular $CF_3$, $C_2F_5$, $C_3F_7$, $C_4F_9$, $C_5F_{11}$, $C_6F_{13}$, $C_7C_{15}$ or $C_8F_{17}$, very preferably $C_6F_{13}$.

The above-mentioned alkyl, alkoxy, alkenyl, oxaalkyl, thioalkyl, carbonyl and carbonyloxy groups can be achiral or chiral groups. Particularly preferred chiral groups are 2-butyl (=1-methylpropyl), 2-methylbutyl, 2-methylpentyl, 3-methylpentyl, 2-ethylhexyl, 2-propylpentyl, in particular 2-methylbutyl, 2-methylbutoxy, 2-methylpentoxy, 3-methylpentoxy, 2-ethyl-hexoxy, 1-methylhexoxy, 2-octyloxy, 2-oxa-3-methylbutyl, 3-oxa-4-methyl-pentyl, 4-methylhexyl, 2-hexyl, 2-octyl, 2-nonyl, 2-decyl, 2-dodecyl, 6-meth-oxyoctoxy, 6-methyloctoxy, 6-methyloctanoyloxy, 5-methyl heptyloxy-carbonyl, 2-methylbutyryloxy, 3-methylvaleroyloxy, 4-methylhexanoyloxy, 2-chloropropionyloxy, 2-chloro-3-methylbutyryloxy, 2-chloro-4-methyl-valeryl-oxy, 2-chloro-3-methylvaleryloxy, 2-methyl-3-oxapentyl, 2-methyl-3-oxahexyl, 1-methoxypropyl-2-oxy, 1-ethoxypropyl-2-oxy, 1-propoxypropyl-2-oxy, 1-butoxypropyl-2-oxy, 2-fluorooctyloxy, 2-fluorodecyloxy, 1,1,1-trifluoro-2-octyloxy, 1,1,1-trifluoro-2-octyl, 2-fluoromethyloctyloxy for example. Very preferred are 2-hexyl, 2-octyl, 2-octyloxy, 1,1,1-trifluoro-2-hexyl, 1,1,1-trifluoro-2-octyl and 1,1,1-trifluoro-2-octyloxy.

Preferred achiral branched groups are isopropyl, isobutyl (=methylpropyl), isopentyl (=3-methylbutyl), tert. butyl, isopropoxy, 2-methyl-propoxy and 3-methylbutoxy.

In another preferred embodiment of the present invention, R is selected from primary, secondary or tertiary alkyl or alkoxy with 1 to 30 C atoms, wherein one or more H atoms are optionally replaced by F, or aryl, alkylated aryl or alkoxy aryl with 4 to 40 C atoms. Especially preferred groups R are selected from the group consisting of the following formulae

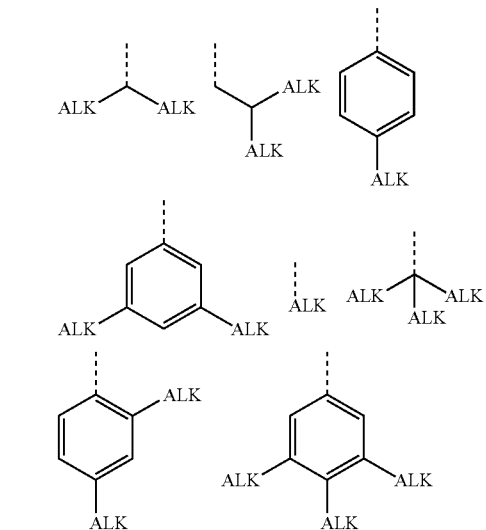

wherein "ALK" denotes optionally fluorinated, preferably linear, alkyl or alkoxy with 1 to 20, preferably 1 to 12 C-atoms, in case of tertiary alkyl or alkoxy very preferably 1 to 9 C atoms, and the dashed line denotes the link to the N-atom in the group of formula II. Especially preferred among these groups are those wherein all ALK subgroups are identical.

—$CY^1$=$CY^2$— is preferably —CH=CH—, —CF=CF— or —CH=C(CN)—.

Halogen is F, Cl, Br or I, preferably F, Cl or Br.

The polymers may also be substituted with a polymerisable or reactive group, which is optionally protected during the process of forming the polymer. Particular preferred polymers of this type are those of formula I wherein $R^1$ denotes P-Sp. These polymers are particularly useful as semiconductors or charge transport materials, as they can be crosslinked via the groups P, for example by polymerisation in situ, during or after processing the polymer into a thin film for a semiconductor component, to yield crosslinked polymer films with high charge carrier mobility and high thermal, mechanical and chemical stability.

Preferably the polymerisable or reactive group P is selected from $CH_2$=$CW^1$—CO—O—, $CH_2$=$CW^1$—CO—,

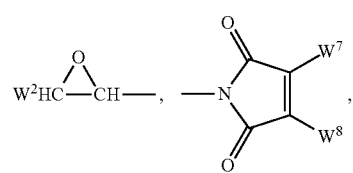

-continued

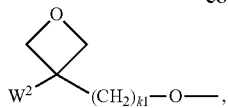

$CH_2=CW^2—(O)_{k1}—$, $CW^1=CH—CO—(O)_{k3}—$, $CW^1=CH—CO—NH—$, $CH_2=CW^1—CO—NH—$, $CH_3—CH=CH—O—$, $(CH_2=CH)_2CH—OCO—$, $(CH_2=CH—CH_2)_2CH—O—CO—$, $(CH_2=CH)_2CH—O—$, $(CH_2=CH—CH_2)_2N—$, $(CH_2=CH—CH_2)_2N—CO—$, $HO—CW^2W^3—$, $HS—CW^2W^3—$, $HW^2N—$, $HO—CW^2W^3—NH—$, $CH_2=CH—(CO—O)_{k1}$-Phe-$(O)_{k2}—$, $CH_2=CH—(CO)_{k1}$-Phe-$(O)_{k2}—$, Phe-$CH=CH—$, $HOOC—$, $OCN—$, and $W^4W^5W^6Si—$, with $W^1$ being H, F, Cl, CN, $CF_3$, phenyl or alkyl with 1 to 5 C-atoms, in particular H, Cl or $CH_3$, $W^2$ and $W^3$ being independently of each other H or alkyl with 1 to 5 C-atoms, in particular H, methyl, ethyl or n-propyl, $W^4$, $W^5$ and $W^6$ being independently of each other Cl, oxaalkyl or oxacarbonylalkyl with 1 to 5 C-atoms, $W^7$ and $W^8$ being independently of each other H, Cl or alkyl with 1 to 5 C-atoms, Phe being 1,4-phenylene that is optionally substituted by one or more groups L as defined above, $k_1$, $k_2$ and $k_3$ being independently of each other 0 or 1, $k_3$ preferably being 1, and $k_4$ being an integer from 1 to 10.

Alternatively P is a protected derivative of these groups which is non-reactive under the conditions described for the process according to the present invention. Suitable protective groups are known to the ordinary expert and described in the literature, for example in Green, "Protective Groups in Organic Synthesis", John Wiley and Sons, New York (1981), like for example acetals or ketals.

Especially preferred groups P are $CH_2=CH—CO—O—$, $CH_2=C(CH_3)—CO—O—$, $CH_2=CF—CO—O—$, $CH_2=CH—O—$, $(CH_2=CH)_2CH—O—CO—$, $(CH_2=CH)_2CH—O—$,

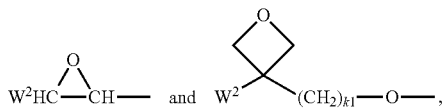

or protected derivatives thereof. Further preferred groups P are selected from the group consisting of vinyloxy, acrylate, methacrylate, fluoroacrylate, chloracrylate, oxetan and epoxy groups, very preferably an acrylate or methacrylate group.

Polymerisation of group P can be carried out according to methods that are known to the ordinary expert and described in the literature, for example in D. J. Broer; G. Challa; G. N. Mol, *Macromol. Chem*, 1991, 192, 59.

The term "spacer group" is known in prior art and suitable spacer groups Sp are known to the ordinary expert (see e.g. Pure Appl. Chem. 73(5), 888 (2001). The spacer group Sp is preferably of formula Sp'-X', such that P-Sp- is P-Sp'-X'-, wherein Sp' is alkylene with up to 30 C atoms which is unsubstituted or mono- or polysubstituted by F, Cl, Br, I or CN, it being also possible for one or more non-adjacent $CH_2$ groups to be replaced, in each case independently from one another, by $—O—$, $—S—$, $—NH—$, $—NR^0—$, $—SiR^0R^{00}—$, $—CO—$, $—COO—$, $—OCO—$, $—OCO—O—$, $—S—CO—$, $—CO—S—$, $—CH=CH—$ or $—C≡C—$ in such a manner that O and/or S atoms are not linked directly to one another, X' is $—O—$, $—S—$, $—CO—$, $—COO—$, $—OCO—$, $—O—COO—$, $—CO—NR^9—$, $—NR^0—CO—$, $—NR^0—CO—NR^{00}—$, $—OCH_2—$, $—CH_2O—$, $—SCH_2—$, $—CH_2S—$, $—CF_2O—$, $—OCF_2—$, $—CF_2S—$, $—SCF_2—$, $—CF_2CH_2—$, $—CH_2CF_2—$, $—CF_2CF_2—$, $—CH=N—$, $—N=CH—$, $—N=N—$, $—CH=CR^0—$, $—CY^1=CY^2—$, $—C≡C—$, $—CH=CH—COOO—$, $—OCO—CH=CH—$ or a single bond, $R^0$ and $R^{00}$ are independently of each other H or alkyl with 1 to 12 C-atoms, and $Y^1$ and $Y^2$ are independently of each other H, F, Cl or CN.

X is preferably $—O—$, $—S—$, $—OCH_2—$, $—CH_2O—$, $—SCH_2—$, $—CH_2S—$, $—CF_2O—$, $—OCF_2—$, $—CF_2S—$, $—SCF_2—$, $—CH_2CH_2—$, $—CF_2CH_2—$, $—CH_2CF_2—$, $—CF_2CF_2—$, $—CH=N—$, $—N=CH—$, $—N=N—$, $—CH=CR^0—$, $—CY^1=CY^2—$, $—C≡C—$ or a single bond, in particular $—O—$, $—S—$, $—C≡C—$, $—CY^1=CY^2—$ or a single bond. In another preferred embodiment X' is a group that is able to form a conjugated system, such as $—C≡C—$ or $—CY^1=CY^2—$, or a single bond.

Typical groups Sp' are, for example, $—(CH_2)_p—$, $—(CH_2CH_2O)_q—CH_2OH_2—$, $—CH_2CH_2—S—CH_2CH_2—$ or $—CH_2CH_2—NH—CH_2CH_2—$ or $—(SiR^0R^{00}—O)_p—$, with p being an integer from 2 to 12, q being an integer from 1 to 3 and $R^0$ and $R^{00}$ having the meanings given above.

Preferred groups Sp' are ethylene, propylene, butylene, pentylene, hexylene, heptylene, octylene, nonylene, decylene, undecylene, dodecylene, octadecylene, ethyleneoxyethylene, methyleneoxybutylene, ethylene-thioethylene, ethylene-N-methyl-iminoethylene, 1-methylalkylene, ethenylene, propenylene and butenylene for example.

The polymers of formula I can be synthesized in a regioregular and regioselective fashion via chemical polymerization. They are easy to synthesize and exhibit several advantageous properties, like a low bandgap, a high charge carrier mobility, a high solubility in organic solvents, a good processability for the device manufacture process, a high oxidative stability and a long lifetime in electronic devices.

The polymers of formula I are preferably selected of formula Ia

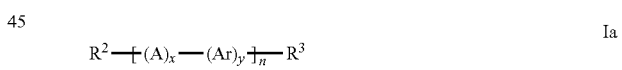

Ia wherein A, Ar, m, n, x and y have the meanings of formula I, and $R^2$ and $R^3$ have independently of each other one of the meanings of $R^1$, preferably halogen, or denote H, $—CH_2Cl$, $—CHO$, $—CH=CH_2$, $—SiR'R''R'''$, $—SnR'R''R'''$, $—BR'R''$, $—B(OR')(OR'')$, $—B(OH)_2$, or P-Sp, wherein P and Sp are as defined in formula I, and R', R" and R''' have independently of each other one of the meanings of $R^0$ given in formula I, and R' and R" may also form a ring together with the hetero atom to which they are attached.

In the polymers of formula I and their preferred subformulae, the total number of repeating units n is preferably ≥5, very preferably ≥10, most preferably ≥50, and preferably up to 500, very preferably up to 1,000, most preferably up to 2,000, including any combination of the aforementioned lower and upper limits of n.

The polymers of formula I and their preferred subformulae include homopolymers and copolymers, like statistical or random copolymers, alternating copolymers and block copolymers, as well as combinations thereof. Block copolymers may for example comprise or consist of one or more blocks formed by units of formula II and one or more blocks formed by units Ar, wherein Ar has one of the meanings as described above and below.

Another aspect of the invention relates to monomers of formula IIa $$R^2\text{-}A\text{-}R^3 \qquad \text{IIa}$$

wherein A is a group of formula II or selected from its preferred subformulae or preferred meanings as described above and below, and $R^2$ and $R^3$ have the meanings given in formula Ia.

Especially preferred are monomers of formula IIa wherein $R^2$ and $R^3$ are, preferably independently of each other, selected from the group consisting of Cl, Br, I, O-tosylate, O-triflate, O-mesylate, O-nonaflate, —SiMe$_2$F, —SiMeF$_2$, —O—SO$_2$Z$^1$, —B(OZ$^2$)$_2$, —CZ$^3$=C(Z$^3$)$_2$, —C≡CH and —Sn(Z$^4$)$_3$, wherein $Z^{1-4}$ are selected from the group consisting of alkyl and aryl, each being optionally substituted, and two groups $Z^2$ may also form a cyclic group.

Preferably the polymers of formula I or Ia, the units of formula II, and the monomers of formula IIa, are selected from the following list of preferred embodiments or any combinations thereof:

n is ≥5, preferably ≥10, very preferably ≥50, and ≤2,000, preferably ≤1,000, very preferably ≤500.

Mw is at least 5,000, preferably at least 8,000, very preferably at least 10,000, and up to 300,000, preferably up to 200,000, very preferably up to 100,000, in all repeating units [(A)$_x$-(Ar)$_y$] x is 1 and y is 0, forming a homopolymer, in at least one repeating unit [(A)$_x$-(Ar)$_y$] y is different from 0, forming a copolymer, in one or more, but not all, repeating units [(A)$_x$-(Ar)$_y$] x is 0 and y is 1, the polymer of formula I or Ia comprises one or more repeating units [(A)$_x$-(Ar)$_y$] wherein x is 1 and y is 0 and one or more repeating units [(A)$_x$-(Ar)$_y$] wherein x is 0 and y is 1, forming a random copolymer, the polymer of formula I or Ia consists only of repeating units [(A)$_x$-(Ar)$_y$] wherein x is 1 and y is 1, forming an alternating copolymer, Ar is an aryl or heteroaryl group which has electron donor properties, including but not limited to aryl and heteroaryl groups selected from the group consisting of selenophene-2,5-diyl, thiophene-2,5-diyl, thieno[3,2-b]thiophene-2,5-diyl, thieno[2,3-b]thiophene-2,5-diyl, selenopheno[3,2-b]selenophene-2,5-diyl, selenopheno[2,3-b]selenophene-2,5-diyl, selenopheno[3,2-b]thiophene-2,5-diyl, selenopheno[2,3-b]thiophene-2,5-diyl, benzo[1,2-b:4,5-b']dithiophene-2,6-diyl, 2,2-dithiophene, 2,2-diselenophene, dithieno[3,2-b:2',3'-d]silole-5,5-diyl, 4H-cyclopenta[2,1-b:3,4'-b']dithiophene-2,6-diyl, 2,7-di-thien-2-yl-carbazole, 2,7-di-thien-2-yl-fluorene, indaceno[1,2-b:5,6-b']dithiophene-2,7-diyl, benzo[1",2":4,5;4",5":4',5']bis(silolo[3,2-b:3',2'-b']thiophene)-2,7-diyl, 2,7-di-thien-2-yl-indaceno[1,2-b:5,6-b']dithiophene, 2,7-di-thien-2-yl-benzo[1",2":4,5;4",5":4',5']bis(silolo[3,2-b:3',2'-b']thiophene)-2,7-diyl, 2,7-di-thien-2-yl-phenanthro[1,10,9,8-c,d,e,f,g]carbazole, all of which are unsubstituted, or mono- or polysubstituted with R, $R^1$ or $R^y$ as defined above and below, preferably the substituents are selected from alkyl, alkoxy, thioalkyl, fluorinated alkyl and fluorinated alkoxy with 1 to 20 C atoms, Ar is an aryl or heteroaryl group which has electron acceptor properties, including but not limited to aryl and heteroaryl groups selected from the group consisting of 4,7-di-thien-2-yl-benzo[2,1,3]thiadiazole, 4,7-di-thien-2-yl-benzo[2,1,3]selenadiazole, 4,7-di-thien-2-yl-benzo[2,1,3]oxadiazole, 4,7-di-thien-2-yl-2H-benzotriazole, 3,4-difluorothiophene-2,5-diyl, thieno[3,4-b]pyrazine-2,5-diyl, 2,5-di-thien-2-yl-thieno[3,4-b]pyrazine, 5,8-di-thien-2-yl-quinoxaline, thieno[3,4-b]thiophene-4,6-diyl, 4,6-di-thien-2-yl-thieno[3,4-b]thiophene, thieno[3,4-b]thiophene-6,4-diyl, 6,4-di-thien-2-yl-thieno[3,4-b]thiophene, 3,6-di-thien-2-yl-pyrrolo[3,4-c]pyrrole-1,4-dione, 2,5-di-thien-2-yl-[1,3]thiazolo[5,4-d][1,3]thiazole, thieno[2,1,3]thiadiazole-2,5-diyl, 2,5-di-thien-2-yl-thieno[2,1,3]thiadiazole, 4,9-di-thien-2-yl-2-thia-1,3,5,8-tetraaza-cyclopenta[b]naphthalene, thieno[3,4-c]pyrrole-4,6-dione-1,3-diyl,1,3-dithien-2-yl-thieno[3,4-c]pyrrole-4,6-dione all of which are unsubstituted, or mono- or polysubstituted with R, $R^1$ or $R^y$ as defined above and below, preferably the substituents are selected from alkyl, alkoxy, thioalkyl, fluorinated alkyl and fluorinated alkoxy with 1 to 20 C atoms, Ar is substituted by one or more groups R, $R^1$ or $R^y$ as described above and below, Ar is selected from aryl or heteroaryl, preferably selected, on each occurrence identically or differently, from the group consisting of selenophene-2,5-diyl, thiophene-2,5-diyl, thieno[3,2-b]thiophene-2,5-diyl, thieno[2,3-b]thiophene-2,5-diyl, selenopheno[3,2-b]selenophene-2,5-diyl, selenopheno[2,3-b]selenophene-2,5-diyl, selenopheno[3,2-b]thiophene-2,5-diyl, selenopheno[2,3-b]thiophene-2,5-diyl, benzo[1,2-b:4,5-b']dithiophene-2,6-diyl, 2,2-dithiophene, 2,2-diselenophene, dithieno[3,2-b:2',3'-d]silole-5,5-diyl, 4H-cyclopenta[2,1-b:3,4-b']dithiophene-2,6-diyl, 2,7-di-thien-2-yl-carbazole, 2,7-di-thien-2-yl-fluorene, indaceno[1,2-b:5,6-b']dithiophene-2,7-diyl, benzo[1",2":4,5;4",5":4',5']bis(silolo[3,2-b:3',2'-b']thiophene)-2,7-diyl, 2,7-di-thien-2-yl-indaceno[1,2-b:5,6-b']dithiophene, 2,7-di-thien-2-yl-benzo[1",2":4,5;4",5":4',5']bis(silolo[3,2-b:3',2'-b']thiophene)-2,7-diyl, 2,7-di-thien-2-yl-phenanthro[1,10,9,8-c,d,e,f,g]carbazole, 4,7-di-thien-2-yl-benzo[2,1,3]thiadiazole, 4,7-di-thien-2-yl-benzo[2,1,3]selenadiazole, 4,7-di-thien-2-yl-benzo[2,1,3]oxadiazole, 4,7-di-thien-2-yl-2H-benzotriazole, 3,4-difluorothiophene-2,5-diyl, thieno[3,4-b]pyrazine-2,5-diyl, 2,5-di-thien-2-yl-thieno[3,4-b]pyrazine, 5,8-di-thien-2-yl-quinoxaline, thieno[3,4-b]thiophene-4,6-diyl, 4,6-di-thien-2-yl-thieno[3,4-b]thiophene, thieno[3,4-b]thiophene-6,4-diyl, 6,4-di-thien-2-yl-thieno[3,4-b]thiophene, 3,6-di-thien-2-yl-pyrrolo[3,4-c]pyrrole-1,4-dione, 2,5-di-thien-2-yl[1,3]thiazolo[5,4-d][1,3]thiazole, thieno[2,1,3]thia-diazole-2,5-diyl, 2,5-di-thien-2-yl-thieno[2,1,3]thiadiazole, 4,9-di-thien-2-yl-2-thia-1,3,5,8-tetraaza-cyclopenta[b]naphthalene, thieno[3,4-c]pyrrole-4,6-dione-1,3-diyl,1,3-dithien-2-yl-thieno[3,4-c]pyrrole-4,6-dione, all of which are unsubstituted, or mono- or polysubstituted with R, $R^1$ or $R^y$ as defined above and below, preferably the substituents are selected from alkyl, alkoxy, thioalkyl, fluorinated alkyl and fluorinated alkoxy with 1 to 20 C atoms, R is H, $R^1$ is H, R is primary alkyl or alkoxy with 1 to 30 C atoms, secondary alkyl or alkoxy with 3 to 30 C atoms, or tertiary alkyl or alkoxy with 4 to 30 C atoms, wherein in all these groups one or more H atoms are optionally replaced by F, R is aryl, alkylated aryl or alkoxy aryl with 4 to 40 C atoms, R is —CO—R$^y$, —CO—O—R$^y$, or —O—CO—R$^y$, very preferably —CO—R$^y$ or —CO—O—R$^y$, wherein R$^y$ is straight-chain, branched or cyclic alkyl with 1 to 30 C atoms, in which one or more non-adjacent C atoms are optionally replaced by —O—, —S—, —CO—, —CO—O—, —O—CO—, —O—CO—O—, —CR$^0$=CR$^{00}$— or —C≡C— and in which one or more H atoms are optionally replaced by F, Cl, Br, I or CN, or R$^y$ is aryl or heteroaryl having 2 to 30 C atoms that is unsubstituted or substituted by one or more non-aromatic groups R$^1$ as defined in formula I, R$^y$ is primary alkyl with 1 to 30 C atoms, very preferably with 1 to 15 C atoms, secondary alkyl with 3 to 30 C atoms, or tertiary alkyl with 4 to 30 C atoms, wherein in all these groups one or more H atoms are optionally replaced by F, R$^y$ is —(CH$_2$)$_o$—CR$^a$R$^b$R$^c$, wherein o is 0, 1, 2, 3, 4 or 5, very preferably 0, 1 or 2, and R$^a$, R$^b$ and R$^c$ are independently of each other C$_1$-C$_{12}$-alkyl, very preferably C$_1$-C$_8$-alkyl, which is optionally substituted by one or more F atoms, and wherein optionally one of R$^a$, R$^b$ and R$^c$ is H, R$^y$ is aryl or alkylated aryl with 4 to 30 C atoms, R$^x$ is alkyl with 1 to 15 C atoms, R and R$^1$, when being a substituent on the group Ar, is alkyl, alkoxy, thioalkyl or fluorinated alkyl or alkoxy with 1 to 20 C atoms, R$^0$ and R$^{00}$ are selected from H or C$_1$-C$_{10}$-alkyl, R$^2$ and R$^3$ are selected from H, halogen, —CH$_2$Cl, —CHO, —CH=CH$_2$—SiR'R''R''', —SnR'R''R''', —BR'R'', —B(OR')(OR''), —B(OH)$_2$, P-Sp, C$_1$-C$_{20}$-alkyl, C$_1$-C$_{20}$-alkoxy, C$_2$-C$_{20}$-alkenyl, C$_1$-C$_{20}$-fluoroalkyl and optionally substituted aryl or heteroaryl, R$^2$ and R$^3$ are, preferably independently of each other, selected from the group consisting of Cl, Br, I, O-tosylate, O-triflate, O-mesylate, O-nonaflate, —SiMe$_2$F, —SiMeF$_2$, —O—SO$_2$Z$^1$, —B(OZ$^2$)$_2$, —CZ$^3$=C(Z$^4$)$_2$, —C≡CH and —Sn(Z$^4$)$_3$, wherein Z$^{1-4}$ are selected from the group consisting of alkyl and aryl, each being optionally substituted, and two groups Z$^2$ may also form a cyclic group, very preferably from Br, R is P-Sp-.

The unit Ar can be a monocyclic, bicyclic or polycyclic group, which preferably consists of aromatic rings. A bicyclic or polycyclic group can comprise two or more rings that are fused and/or two or more rings that are connected by a single or double bond. The rings in these monocyclic, bicyclic and polycyclic groups can also contain one or more hetero atoms, preferably selected from N, S and O, and are preferably selected from aromatic or heteroaromatic rings.

In a preferred embodiment Ar is a unit of formula III

-Ar$^1$-Ar$^3$-Ar$^2$-      III wherein

Ar$^1$, Ar$^2$ are independently of each other selected from the group consisting of the following formulae and their mirror images

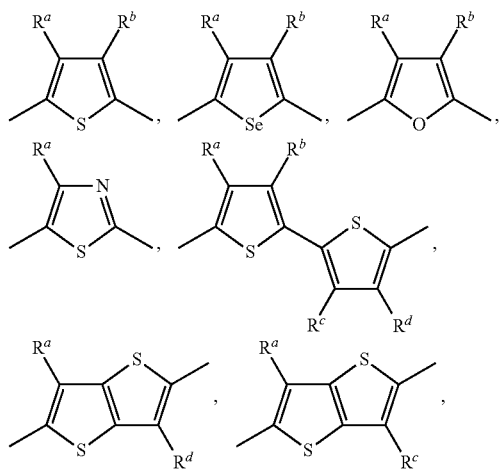

and one of Ar$^1$ and Ar$^2$ may also be a single bond,

Ar$^3$ is selected from the group consisting of thieno[3,2-b]thiophene-2,5-diyl, thieno[2,3-b]thiophene-2,5-diyl, selenopheno[3,2-b]selenophene-2,5-diyl, selenopheno[2,3-b]selenophene-2,5-diyl, selenopheno[3,2-b]thiophene-2,5-diyl, selenopheno[2,3-b]thiophene-2,5-diyl, benzo[1,2-b:4,5-b']dithiophene-2,6-diyl, dithieno[3,2-b:2',3'-d]silole-5,5-diyl, 4H-cyclopenta[2,1 -b:3,4-b']dithiophene-2,6-diyl, carbazole-2,7-diyl, fluorene-2,7-diyl, indaceno[1,2-b:5,6-b']dithiophene-2,7-diyl, benzo[1'',2'':4,5;4'',5'':4',5']bis(silolo[3,2-b:3',2'-b']thiophene)-2,7-diyl, indaceno[1,2-b:5,6-b']dithiophene-2,7-diyl, phenanthro[1,10,9,8-c,d,e,f,g]carbazole-2,7-diyl, benzo[2,1,3]thiadiazole-4,7-diyl, benzo[2,1,3]selenadiazole-4,7-diyl, benzo[2,1,3]oxadiazole-4,7-diyl, 2H-benzotriazole-4,7-diyl, thieno[3,4-b]pyrazine-2,5-diyl, quinoxaline-5,8-diyl, thieno[3,4-b]thiophene-4,6-diyl, thieno[3,4-b]thiophene-6,4-diyl, pyrrolo[3,4-c]pyrrole-1,4-dione-3,6-diyl, [1,3]thiazolo[5,4-d][1,3]thiazole-2,5-diyl, thieno[2,1,3]thiadiazole-2,5-diyl, 2-thia-1,3,5,8-tetraaza-cyclopenta[b]naphthalene-4,9-diyl, thieno[3,4-c]pyrrole-4,6-dione-1,3-diyl, all of which are unsubstituted, or mono- or polysubstituted with R, R$^1$ or R$^y$ as defined above and below, preferably the substituents are selected from alkyl, alkoxy, thioalkyl, fluorinated alkyl and fluorinated alkoxy with 1 to 20 C atoms, R$^{a-d}$ have one of the meanings given for R$^1$ in formula I or as described above and below, preferably the substituents being different from H are selected from alkyl, alkoxy, thioalkyl, fluorinated alkyl and fluorinated alkoxy with 1 to 20 C atoms, further preferably R$^a$ and R$^d$ have the same meaning and/or R$^b$ and R$^c$ have the same meaning, very preferably R$^a$ and R$^d$ denote H and R$^b$ and R$^c$ are different from H, further preferably R$^b$ and R$^c$ denote H and R$^a$ and R$^d$ are different from H.

Ar$^1$ and Ar$^2$ can be identical or different. Preferably Ar$^1$ and Ar$^2$ have the same meaning, or Ar$^1$ is the mirror image of Ar$^2$ (for example Ar$^1$ is

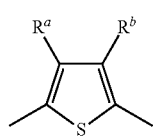

and Ar² is

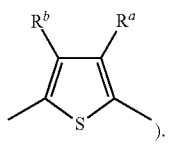

In a preferred embodiment one of Ar¹ and Ar² is a single bond. In another preferred embodiment both Ar¹ and Ar² are different from a single bond.

The unit of formula III is preferably selected of formula IIIa

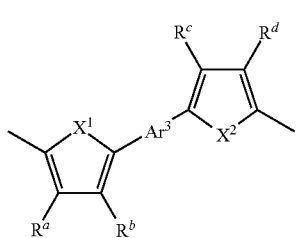

IIIa wherein Ar³, $R^a$, $R^b$, $R^c$ and $R^d$ are as defined in formula III, and $X^1$, $X^2$ denote independently of each other O, S or Se, preferably both $X^1$ and $X^2$ have the same meaning and very preferably denote S.

In a preferred embodiment Ar is a unit of formula IIIa, wherein $X^1$ and $X^2$ are S or Se, very preferably S, $R^a$-$R^d$ are H, and Ar³ is selected from benzo[2,1,3]thiadiazole-4,7-diyl, benzo[2,1,3]selenadiazole-4,7-diyl, benzo[2,1,3]oxadiazole-4,7-diylor 2H-benzotriazole-4,7-diyl, very preferably benzo[2,1,3]thiadiazole-4,7-diyl, all of which are unsubstituted or substituted with one or two groups selected from alkyl, alkoxy, thioalkyl, fluorinated alkyl and fluorinated alkoxy with 1 to 20 C atoms.

The polymers of the present invention can be synthesized according to or in analogy to methods that are known to the skilled person and are described in the literature. Other methods of preparation can be taken from the examples. For example, they can be suitably prepared by aryl-aryl coupling reactions, such as Yamamoto coupling, Suzuki coupling, Stille coupling, Sonogashira coupling, Heck coupling or Buchwald coupling. Suzuki coupling and Yamamoto coupling are especially preferred.

The monomers which are polymerised to form the repeat units of the polymers can be prepared according to methods which are known to the person skilled in the art.

Preferably the polymers are prepared from monomers of formula Ia or its preferred embodiments as described above and below.

Another aspect of the invention is a process for preparing a polymer by coupling one or more identical or different monomeric units of formula I or monomers of formula Ia with each other and/or with one or more comonomers in a polymerisation reaction, preferably in an aryl-aryl coupling reaction.

Suitable and preferred comonomers are those of the formula $R^2$—Ar—$R^3$ 

wherein Ar, $R^2$ and $R^3$ are as defined above.

Preferred methods for polymerisation are those leading to C—C-coupling or C—N-coupling, like Suzuki polymerisation, as described for example in WO 00/53656, Yamamoto polymerisation, as described in for example in T. Yamamoto et al., Progress in Polymer Science 1993, 17, 1153-1205 or in WO 2004/022626 A1, and Stille coupling. For example, when synthesizing a linear polymer by Yamamoto polymerisation, monomers as described above having two reactive halide groups $R^2$ and $R^3$ is preferably used. When synthesizing a linear polymer by Suzuki polymerisation, preferably a monomer as described above is used wherein at least one reactive group $R^2$ or $R^3$ is a boronic acid or boronic acid derivative group.

Suzuki polymerisation may be used to prepare homopolymers as well as statistical, alternating and block random copolymers. Statistical or block copolymers can be prepared for example from the above monomers of formula Ia wherein one of the reactive groups $R^2$ and $R^3$ is halogen and the other reactive group is a boronic acid or boronic acid derivative group. The synthesis of statistical, alternating and block copolymers is described in detail for example in WO 03/048225 A2 or WO 2005/014688 A2.

Suzuki polymerisation employs a Pd(0) complex or a Pd(II) salt. Preferred Pd(0) complexes are those bearing at least one phosphine ligand such as $Pd(Ph_3P)_4$. Another preferred phosphine ligand is tris(ortho-tolyl)phosphine, i.e. $Pd(o-Tol)_4$. Preferred Pd(II) salts include palladium acetate, i.e. $Pd(OAc)_2$. Suzuki polymerisation is performed in the presence of a base, for example sodium carbonate, potassium phosphate or an organic base such as tetraethylammonium carbonate. Yamamoto polymerisation employs a Ni(0) complex, for example bis(1,5-cyclooctadienyl)nickel(0).

As alternatives to halogens as described above, leaving groups of formula —O—$SO_2Z^1$ can be used wherein $Z^1$ is as described above. Particular examples of such leaving groups are tosylate, mesylate and triflate.

Especially suitable and preferred synthesis methods for the units and monomers of formula II and IIa, and their homo- and co-polymers of formula I and Ia, are illustrated in the synthesis schemes shown hereinafter. Therein R is as defined in formula I.

The generic synthesis of the 9,10-dihydrobenzo[def] carbazole monomer with solubilizing groups and reactive bromo or boronic acid or boronic acid ester groups in 2- and 6-position is exemplarily illustrated in Scheme 1.

Scheme 1:

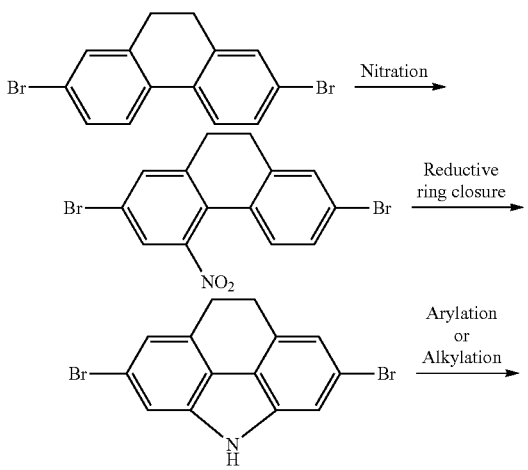

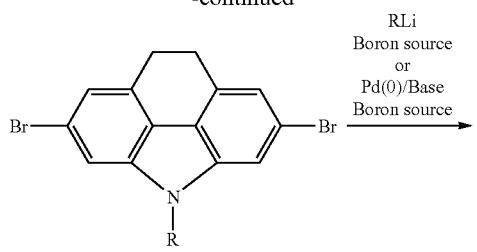

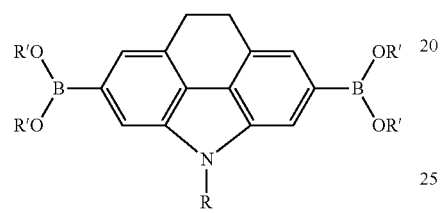

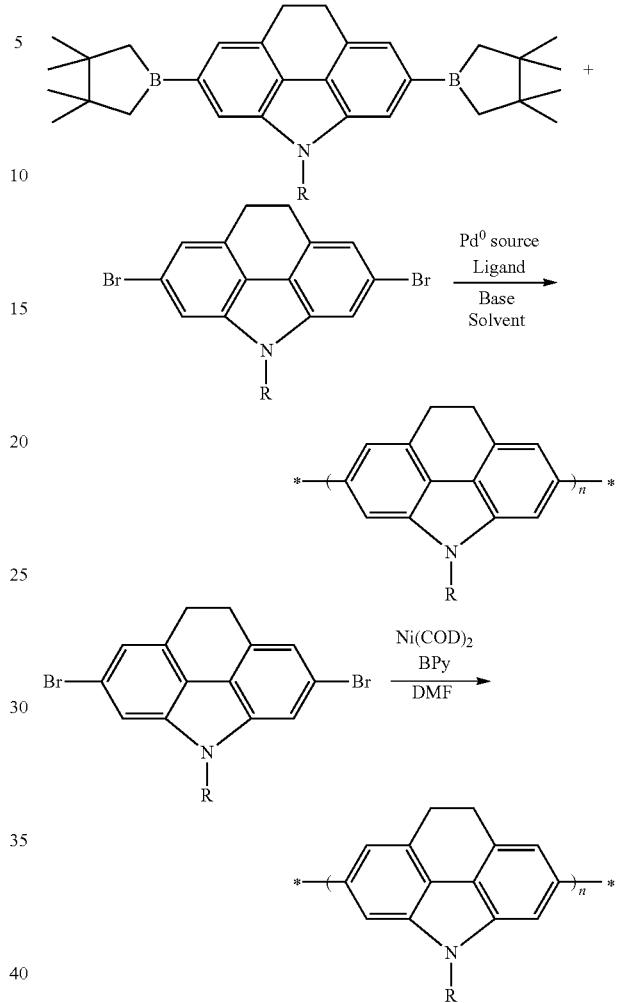

The synthesis of the 8,9-dihydrobenzo[def]carbazole units is carried out from nitration of the 2,7-dibromo-9,10-dihydrophenanthrene followed by a reductive ring closure reaction and either an alkylation or arylation reaction to incorporate the solubilizing group. The final 8,9-dihydrobenzo[def]carbazole units are prepared readily via double lithium halogen exchange reaction or palladium catalyst reaction in presence of a boron source to obtain the double boronic acid or ester functionalized product.

The polymers can be synthesized by various organometallic catalyzed reactions such as Yamamoto,[11,12] Suzuki[13] or Stille[14] coupling. The homopolymers are preferably, but not exclusively, synthesized using Yamamoto or Suzuki coupling. The copolymers are preferably, but not exclusively, prepared using Suzuki or Stille coupling. as exemplarily illustrated in Schemes 2 and 3.

Scheme 3:

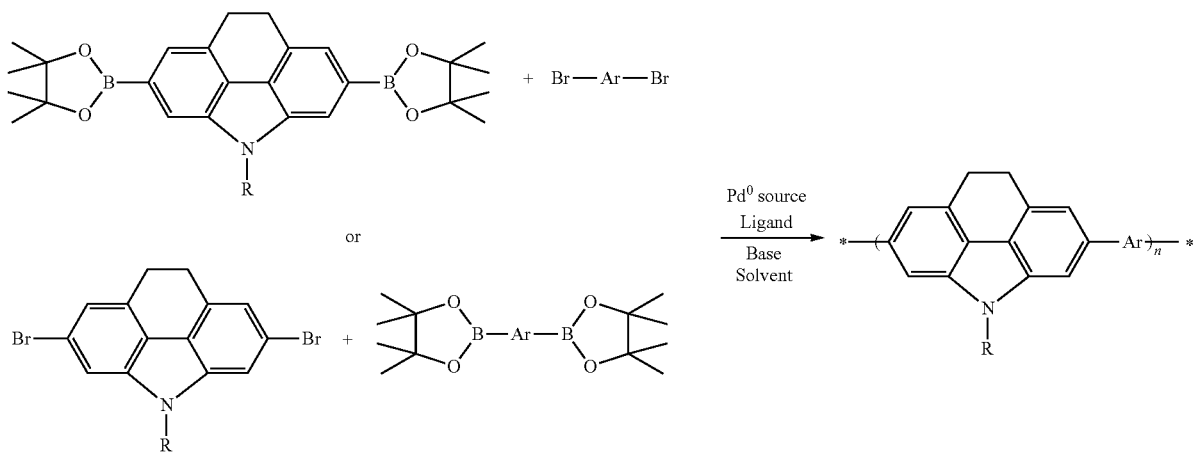

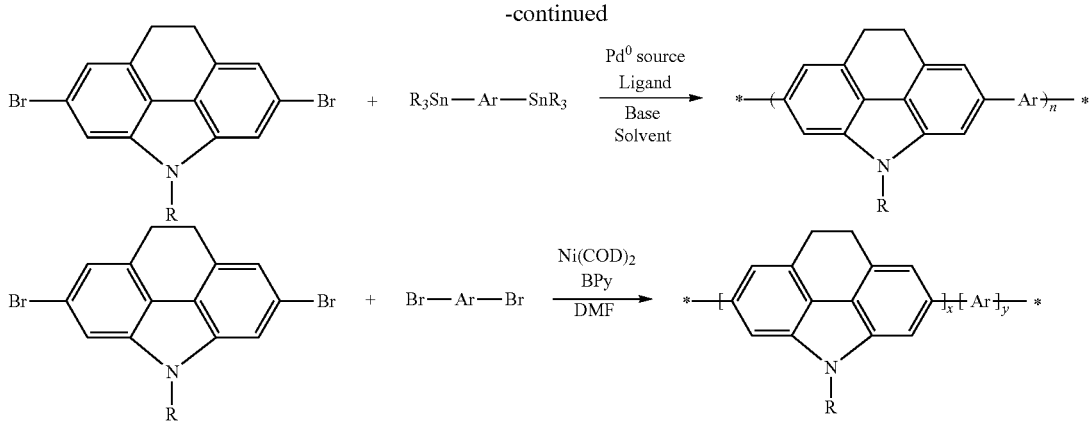

More specifically, the 2,6-functionalized 8,9-dihydrobenzo[def]carbazole units can be synthesized in four steps from 2,7-dibromo-9,10-dihydrophenanthrene, as shown in Scheme 4 (wherein RT means room temperature).

Scheme 4:

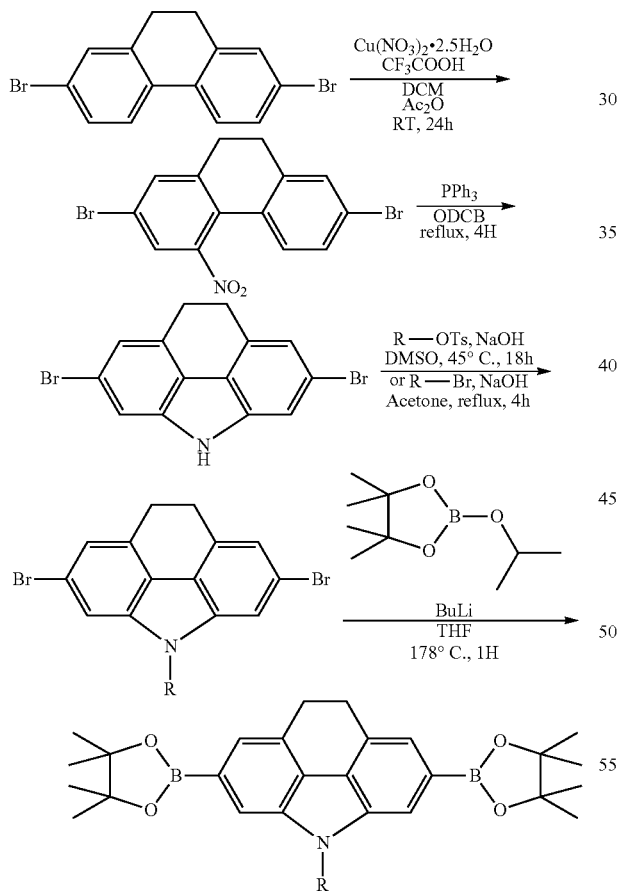

The 2,7-dibromo-9,10-dihydrophenanthrene is first nitrated with $Cu(NO_3)_2 \cdot 2.5H_2O$ in a mixture of dichloromethane, acetic acid and trifluoacetic acid. The resulting product is reacted with the triphenylphosphine in o-dichlorobenzene to obtain the 2,6-dibromo-8,9-dihydrobenzo[def]carbazole. This product is alkylated using either the corresponding alkyl p-toluenesulfonate or bromoalkane and then the final product is synthesized via a double lithium halogen exchange following by the addition of the 2-isopropoxy-4,4,5,5-tetramethyl-1,3,2-dioxaborolane.

Copolymers can be prepared using a Suzuki coupling polymerization as exemplarily illustrated in Schemes 5 and 6 (for the cases where R is 1-octyl-nonyl or octyl). Alternatively the corresponding dibromo monomer of the 8,9-dihydrobenzo[def]carbazole and the corresponding dioxaborolan monomer of the bisthienyl-benzothiadiazole can be used, as shown in Scheme 3 above.

Scheme 5:

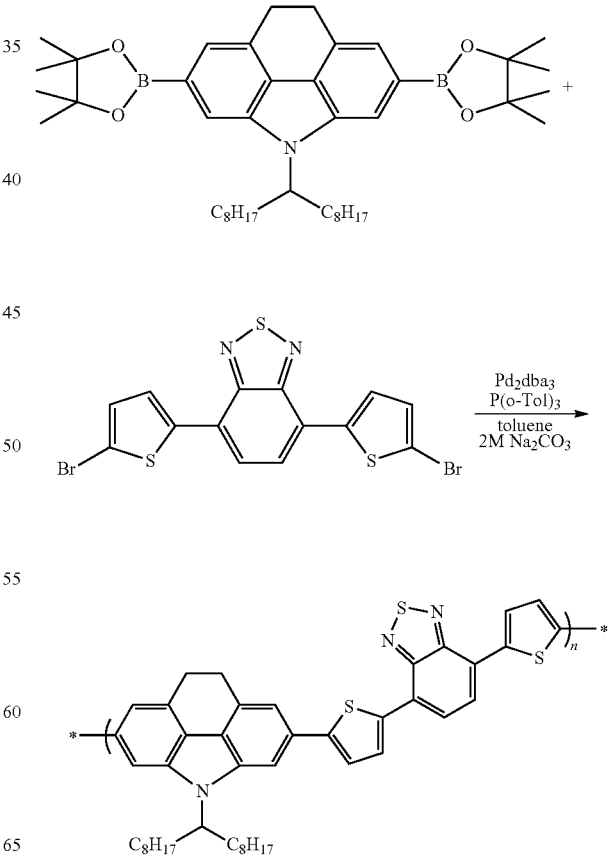

Scheme 6:

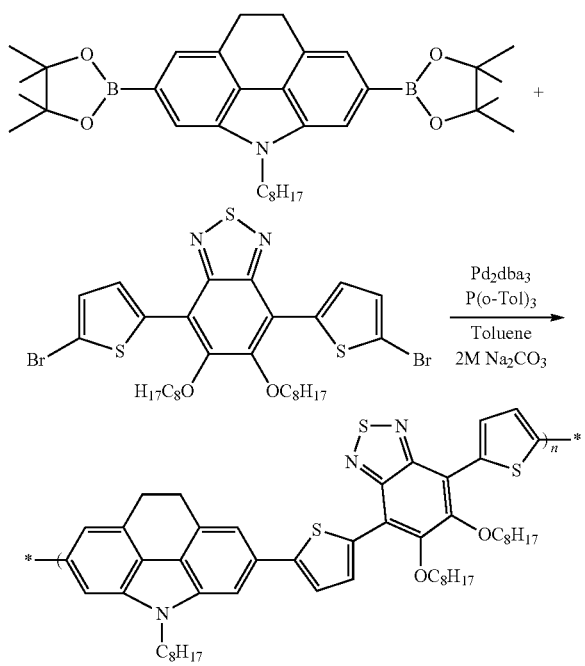

The novel methods of preparing monomers and polymers as described above and below are another aspect of the invention.

The polymers according to the present invention can also be used in polymer blends, for example together with other polymers having charge-transport, semiconducting, electrically conducting, photoconducting and/or light emitting semiconducting properties, or for example with polymers having hole blocking or electron blocking properties for use as interlayers or charge blocking layers in OLED devices. Thus, another aspect of the invention relates to a polymer blend comprising one or more polymers according to the present invention and one or more further polymers having one or more of the above-mentioned properties. These blends can be prepared by conventional methods that are described in prior art and known to the skilled person. Typically the polymers are mixed with each other or dissolved in suitable solvents and the solutions combined.

Another aspect of the invention relates to a formulation comprising one or more polymers or polmyer blends as described above and below and one or more organic solvents.

Preferred solvents are aliphatic hydrocarbons, chlorinated hydrocarbons, aromatic hydrocarbons, ketones, ethers and mixtures thereof. Additional solvents which can be used include 1,2,4-trimethylbenzene, 1,2,3,4-tetramethyl benzene, pentylbenzene, mesitylene, cumene, cymene, cyclohexylbenzene, diethylbenzene, tetralin, decalin, 2,6-lutidine, 2-fluoro-m-xylene, 3-fluoro-o-xylene, 2-chlorobenzotrifluoride, dimethylformamide, 2-chloro-6fluorotoluene, 2-fluoroanisole, anisole, 2,3-dimethylpyrazine, 4-fluoroanisole, 3-fluoroanisole, 3-trifluoro-methylanisole, 2-methylanisole, phenetol, 4-methylansiole, 3-methylanisole, 4-fluoro-3-methylanisole, 2-fluorobenzonitrile, 4-fluoroveratrol, 2,6-dimethylanisole, 3-fluorobenzonitrile, 2,5-dimethylanisole, 2,4-dimethylanisole, benzonitrile, 3,5-dimethylanisole, N,N-dimethylaniline, ethyl benzoate, 1-fluoro-3,5-dimethoxybenzene, 1-methylnaphthalene, N-methylpyrrolidinone, 3-fluorobenzotrifluoride, benzotrifluoride, benzotrifluoride, diosane, trifluoromethoxybenzene, 4-fluorobenzotrifluoride, 3-fluoropyridine, toluene, 2-fluorotoluene, 2-fluorobenzotrifluoride, 3-fluorotoluene, 4-isopropylbiphenyl, phenyl ether, pyridine, 4-fluorotoluene, 2,5-difluorotoluene, 1-chloro-2,4-difluorobenzene, 2-fluoropyridine, 3-chlorofluorobenzene, 3-chlorofluorobenzene, 1-chloro-2,5-difluorobenzene, 4-chlorofluorobenzene, chlorobenzene, o-dichlorobenzene, 2-chlorofluorobenzene, p-xylene, m-xylene, o-xylene or mixture of o-, m-, and p-isomers. Solvents with relatively low polarity are generally preferred. For inkjet printing solvents with high boiling temperatures and solvent mixtures are preferred. For spin coating alkylated benzenes like xylene and toluene are preferred.

Examples of especially preferred solvents include, without limitation, dichloromethane, trichloromethane, monochlorobenzene, o-dichlorobenzene, tetrahydrofuran, anisole, morpholine, toluene, o-xylene, m-xylene, p-xylene, 1,4-dioxane, acetone, methylethylketone, 1,2-dichloroethane, 1,1,1-trichloroethane, 1,1,2,2-tetrachloroethane, ethyl acetate, n-butyl acetate, dimethylformamide, dimethylacetamide, dimethylsulfoxide, tetraline, decaline, indane, methyl benzoate, ethyl benzoate, mesitylene and/or mixtures thereof.

The concentration of the polymers in the solution is preferably 0.1 to 10% by weight, more preferably 0.5 to 5% by weight. Optionally, the solution also comprises one or more binders to adjust the rheological properties, as described for example in WO 2005/055248 A1.

After the appropriate mixing and ageing, solutions are evaluated as one of the following categories: complete solution, borderline solution or insoluble. The contour line is drawn to outline the solubility parameter-hydrogen bonding limits dividing solubility and insolubility. 'Complete' solvents falling within the solubility area can be chosen from literature values such as published in "Crowley, J. D., Teague, G. S. Jr and Lowe, J. W. Jr., Journal of Paint Technology, 38, No 496, 296 (1966)". Solvent blends may also be used and can be identified as described in "Solvents, W. H. Ellis, Federation of Societies for Coatings Technology, p 9-10, 1986". Such a procedure may lead to a blend of 'non' solvents that will dissolve both the polymers of the present invention, although it is desirable to have at least one true solvent in a blend.

The polymers according to the present invention can also be used in patterned OSC layers in the devices as described above and below. For applications in modern microelectronics it is generally desirable to generate small structures or patterns to reduce cost (more devices/unit area), and power consumption. Patterning of thin layers comprising a polymer according to the present invention can be carried out for example by photolithography, electron beam lithography or laser patterning.

For use as thin layers in electronic or electrooptical devices the polymers, polymer blends or formulations of the present invention may be deposited by any suitable method. Liquid coating of devices is more desirable than vacuum deposition techniques. Solution deposition methods are especially preferred. The formulations of the present invention enable the use of a number of liquid coating techniques. Preferred deposition techniques include, without limitation, dip coating, spin coating, ink jet printing, letter-press printing, screen printing, doctor blade coating, roller printing, reverse-roller printing, offset lithography printing, flexographic printing, web printing, spray coating, brush coating or pad printing. Ink-jet printing is particularly preferred as it allows high resolution layers and devices to be prepared.

Selected formulations of the present invention may be applied to prefabricated device substrates by ink jet printing or microdispensing. Preferably industrial piezoelectric print heads such as but not limited to those supplied by Aprion, Hitachi-Koki, InkJet Technology, On Target Technology, Picojet, Spectra, Trident, Xaar may be used to apply the organic semiconductor layer to a substrate. Additionally semi-industrial heads such as those manufactured by Brother, Epson, Konica, Seiko Instruments Toshiba TEC or single nozzle microdispensers such as those produced by Microdrop and Microfab may be used.

In order to be applied by ink jet printing or microdispensing, the polymers should be first dissolved in a suitable solvent. Solvents must fulfil the requirements stated above and must not have any detrimental effect on the chosen print head. Additionally, solvents should have boiling points >100° C., preferably >140° C. and more preferably >150° C. in order to prevent operability problems caused by the solution drying out inside the print head. Apart from the solvents methoned above, suitable solvents include substituted and non-substituted xylene derivatives, di-$C_{1-2}$-alkyl formamide, substituted and non-substituted anisoles and other phenol-ether derivatives, substituted heterocycles such as substituted pyridines, pyrazines, pyrimidines, pyrrolidinones, substituted and non-substituted N,N-di-$C_{1-2}$-alkylanilines and other fluorinated or chlorinated aromatics.

A preferred solvent for depositing a polymer according to the present invention by ink jet printing comprises a benzene derivative which has a benzene ring substituted by one or more substituents wherein the total number of carbon atoms among the one or more substituents is at least three. For example, the benzene derivative may be substituted with a propyl group or three methyl groups, in either case there being at least three carbon atoms in total. Such a solvent enables an ink jet fluid to be formed comprising the solvent with the polymer, which reduces or prevents clogging of the jets and separation of the components during spraying. The solvent(s) may include those selected from the following list of examples: dodecylbenzene, 1-methyl-4-tert-butylbenzene, terpineol limonene, isodurene, terpinolene, cymene, diethylbenzene. The solvent may be a solvent mixture, that is a combination of two or more solvents, each solvent preferably having a boiling point >100° C., more preferably >140° C. Such solvent(s) also enhance film formation in the layer deposited and reduce defects in the layer.

The ink jet fluid (that is mixture of solvent, binder and semiconducting compound) preferably has a viscosity at 20° C. of 1-100 mPa·s, more preferably 1-50 mPa s and most preferably 1-30 mPa·s.

The polymers or formulations according to the present invention can additionally comprise one or more further components or additives selected for for example from surface-active compounds, lubricating agents, wetting agents, dispersing agents, hydrophobing agents, adhesive agents, flow improvers, defoaming agents, deaerators, diluents which may be reactive or non-reactive, auxiliaries, colourants, dyes or pigments, sensitizers, stabilizers, nanoparticles or inhibitors.

The polymers according to the present invention are useful as charge transport, semiconducting, electrically conducting, photoconducting or light mitting materials in optical, electrooptical, electronic, electroluminescent or photoluminescent components or devices. In these devices, the polymers of the present invention are typically applied as thin layers or films.

Thus, the present invention also provides the use of the semiconducting polymer, polymer blend, formulation or layer in an electronic device. The formulation may be used as a high mobility semiconducting material in various devices and apparatus. The formulation may be used, for example, in the form of a semiconducting layer or film. Accordingly, in another aspect, the present invention provides a semiconducting layer for use in an electronic device, the layer comprising a polymer, polymer blend or formulation according to the invention. The layer or film may be less than about 30 microns. For various electronic device applications, the thickness may be less than about 1 micron thick. The layer may be deposited, for example on a part of an electronic device, by any of the aforementioned solution coating or printing techniques.

The invention additionally provides an electronic device comprising a polymer, polymer blend, formulation or organic semiconducting layer according to the present invention. Especially preferred devices are OFETs, TFTs, ICs, logic circuits, capacitors, RFID tags, OLEDs, OLETs, OPEDs, OPVs, solar cells, laser diodes, photoconductors, photodetectors, electrophotographic devices, electrophotographic recording devices, organic memory devices, sensor devices, charge injection layers, Schottky diodes, planarising layers, antistatic films, conducting substrates and conducting patterns.

Especially preferred electronic device are OFETs, OLEDs and OPV devices, in particular bulk heterojunction (BHJ) OPV devices. In an OFET, for example, the active semiconductor channel between the drain and source may comprise the layer of the invention. As another example, in an OLED device, the charge (hole or electron) injection or transport layer may comprise the layer of the invention.

For use in OPV devices the polymer according to the present invention is preferably used in a formulation that comprises or contains, more preferably consists essentially of, very preferably exclusively of, a p-type (electron donor) semiconductor and an n-type (electron acceptor) semiconductor. The p-type semiconductor is constituted by a polymer according to the present invention. The n-type semiconductor can be an inorganic material such as zinc oxide or cadmium selenide, or an organic material such as a fullerene derivate, for example (6,6)-phenyl C61-butyric acid methyl ester, also known as "PCBM" or "$PC_{61}BM$", as disclosed for example in G. Yu, J. Gao, J. C. Hummelen, F. Wudl, A. J. Heeger, Science 1995, Vol. 270, p. 1789 ff and having the structure shown below, or an structural analogous compound with e.g. a $C_{71}$ fullerene group ($PC_{71}BM$), or a polymer (see for example Coakley, K. M. and McGehee, M. D. *Chem. Mater.* 2004, 16, 4533).

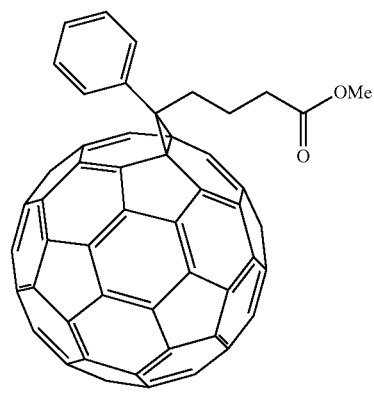

$PC_{61}BM$

A preferred material of this type is a blend or mixture of a polymer according to the present invention with a $C_{60}$ or $C_{70}$ fullerene or modified $C_{60}$ fullerene like $PC_{61}BM$ or $PC_{71}BM$. Preferably the ratio polymer:fullerene is from 2:1 to 1:2 by weight, more preferably from 1.2:1 to 1:1.2 by weight, most preferably 1:1 by weight. For the blended mixture, an optional annealing step may be necessary to optimize blend morphology and consequently OPV device performance.

The OPV device can for example be of any type known from the literature [see e.g. Waldauf et al., Appl. Phys. Lett. 89, 233517 (2006)].

A typical and preferred OPV device according to the present invention, comprises:
 a low work function electrode (for example a metal, such as aluminum), and a high work function electrode (for example ITO), one of which is transparent,
 a layer (also referred to as "active layer") comprising a hole transporting material and an electron transporting material, preferably selected from OSC materials, situated between the electrodes; the active layer can exist for example as a bilayer or two distinct layers or blend or mixture of p-type and n-type semiconductor, forming a bulk heterjunction (BHJ) (see for example Coakley, K. M. and McGehee, M. D. *Chem. Mater.* 2004, 16, 4533),
 an optional conducting polymer layer, for example comprising a blend of PEDOT:PSS (poly(3,4-ethylenedioxythiophene):poly(styrenesulfonate)), situated between the active layer and the high work function electrode, to modify the work function of the high work function electrode to provide an ohmic contact for holes,
 an optional coating (for example of LiF) on the side of the low workfunction electrode facing the active layer (13), to provide an ohmic contact for electrons.

A typical and preferred inverted OPV device according to the present invention, comprising:
 a low work function electrode (for example a metal, such as gold), and a high work function electrode (for example ITO), one of which is transparent,
 a layer (also referred to as "active layer") comprising a hole transporting material and an electron transporting material, preferably selected from OSC materials, situated between the electrodes; the active layer can exist for example as a bilayer or two distinct layers or blend or mixture of p-type and n-type semiconductor, forming a BHJ,
 an optional conducting polymer layer, for example comprising a blend of PEDOT:PSS, situated between the active layer and the low work function electrode to provide an ohmic contact for electrons,
 an optional coating (for example of $TiO_x$) on the side of the high workfunction electrode facing the active laye, to provide an ohmic contact for holes.

In the OPV devices of the present invent invention, the p-type and n-type semiconductor materials are preferably selected from the materials, like the polymer/fullerene systems, as described above. If the bilayer is a blend an optional annealing step may be necessary to optimize device performance.

The compound, formulation and layer of the present invention are also suitable for use in an OFET as the semiconducting channel. Accordingly, the invention also provides an OFET comprising a gate electrode, an insulating (or gate insulator) layer, a source electrode, a drain electrode and an organic semiconducting channel connecting the source and drain electrodes, wherein the organic semiconducting channel comprises a polymer, polymer blend, formulation or organic semiconducting layer according to the present invention. Other features of the OFET are well known to those skilled in the art.

OFETs where an OSC material is arranged as a thin film between a gate dielectric and a drain and a source electrode, are generally known, and are described for example in U.S. Pat. No. 5,892,244, U.S. Pat. No. 5,998,804, U.S. Pat. No. 6,723,394 and in the references cited in the background section. Due to the advantages, like low cost production using the solubility properties of the compounds according to the invention and thus the processibility of large surfaces, preferred applications of these FETs are such as integrated circuitry, TFT displays and security applications.

The gate, source and drain electrodes and the insulating and semiconducting layer in the OFET device may be arranged in any sequence, provided that the source and drain electrode are separated from the gate electrode by the insulating layer, the gate electrode and the semiconductor layer both contact the insulating layer, and the source electrode and the drain electrode both contact the semiconducting layer.

An OFET device according to the present invention preferably comprises:
 a source electrode,
 a drain electrode,
 a gate electrode,
 a semiconducting layer,
 one or more gate insulator layers,
 optionally a substrate.
wherein the semiconductor layer preferably comprises a polymer, polymer blend or formulation as described above and below.

The OFET device can be a top gate device or a bottom gate device. Suitable structures and manufacturing methods of an OFET device are known to the skilled in the art and are described in the literature, for example in US 2007/0102696 A1.

The gate insulator layer preferably comprises a fluoropolymer, like e.g. the commercially available Cytop 809M® or Cytop 107M® (from Asahi Glass). Preferably the gate insulator layer is deposited, e.g. by spin-coating, doctor blading, wire bar coating, spray or dip coating or other known methods, from a formulation comprising an insulator material and one or more solvents with one or more fluoro atoms (fluorosolvents), preferably a perfluorosolvent. A suitable perfluorosolvent is e.g. FC75® (available from Acros, catalogue number 12380). Other suitable fluoropolymers and fluorosolvents are known in prior art, like for example the perfluoropolymers Teflon AF® 1600 or 2400 (from DuPont) or Fluoropel® (from Cytonix) or the perfluorosolvent FC 43® (Acros, No. 12377). Especially preferred are organic dielectric materials having a low permittivity (or dielectric contant) from 1.0 to 5.0, very preferably from 1.8 to 4.0 ("low k materials"), as disclosed for example in US 2007/0102696 A1 or U.S. Pat. No. 7,095,044.

In security applications, OFETs and other devices with semiconducting materials according to the present invention, like transistors or diodes, can be used for RFID tags or security markings to authenticate and prevent counterfeiting of documents of value like banknotes, credit cards or ID cards, national ID documents, licenses or any product with monetry value, like stamps, tickets, shares, cheques etc.

Alternatively, the materials according to the invention can be used in OLEDs, e.g. as the active display material in a flat panel display applications, or as backlight of a flat panel display like e.g. a liquid crystal display. Common OLEDs are realized using multilayer structures. An emission layer is generally sandwiched between one or more electron-transport and/or hole-transport layers. By applying an electric voltage electrons and holes as charge carriers move towards the emission layer where their recombination leads to the excitation and hence luminescence of the lumophor units contained in the emission layer. The inventive compounds, materials and films may be employed in one or more of the charge transport layers and/or in the emission layer, corresponding to their electrical and/or optical properties. Furthermore their use within the emission layer is especially advantageous, if the compounds, materials and films according to the invention show electroluminescent properties themselves or comprise electroluminescent groups or compounds. The selection, characterization as well as the processing of suitable monomeric, oligomeric and polymeric compounds or materials for the use in OLEDs is generally known by a person skilled in the art, see, e.g., Meerholz, Synthetic Materials, 111-112, 2000, 31-34, Alcala, J. Appl. Phys., 88, 2000, 7124-7128 and the literature cited therein.

According to another use, the materials according to the present invention, especially those which show photoluminescent properties, may be employed as materials of light sources, e.g., of display devices such as described in EP 0 889 350 A1 or by C. Weder et al., Science, 279, 1998, 835-837.

A further aspect of the invention relates to both the oxidised and reduced form of the compounds according to this invention. Either loss or gain of electrons results in formation of a highly delocalised ionic form, which is of high conductivity. This can occur on exposure to common dopants. Suitable dopants and methods of doping are known to those skilled in the art, e.g. from EP 0 528 662, U.S. Pat. No. 5,198,153 or WO 96/21659.

The doping process typically implies treatment of the semiconductor material with an oxidating or reducing agent in a redox reaction to form delocalised ionic centres in the material, with the corresponding counterions derived from the applied dopants. Suitable doping methods comprise for example exposure to a doping vapor in the atmospheric pressure or at a reduced pressure, electrochemical doping in a solution containing a dopant, bringing a dopant into contact with the semiconductor material to be thermally diffused, and ion-implantantion of the dopant into the semiconductor material.

When electrons are used as carriers, suitable dopants are for example halogens (e.g., $I_2$, $Cl_2$, $Br_2$, ICl, $ICl_3$, IBr and IF), Lewis acids (e.g., $PF_5$, $AsF_5$, $SbF_5$, $BF_3$, $BCl_3$, $SbCl_5$, $BBr_3$ and $SO_3$), protonic acids, organic acids, or amino acids (e.g., HF, HCl, $HNO_3$, $H_2SO_4$, $HClO_4$, $FSO_3H$ and $ClSO_3H$), transition metal compounds (e.g., $FeCl_3$, FeOCl, $Fe(ClO_4)_3$, $Fe(4-CH_3C_6H_4SO_3)_3$, $TiCl_4$, $ZrCl_4$, $HfCl_4$, $NbF_5$, $NbCl_5$, $TaCl_5$, $MoF_5$, $MoCl_5$, $WF_5$, $WCl_6$, $UF_6$ and $LnCl_3$ (wherein Ln is a lanthanoid), anions (e.g., $Cl^-$, $Br^-$, $I^-$, $I_3^-$, $HSO_4^-$, $SO_4^{2-}$, $NO_{3hu\ -}$, $BF_4^-$, $PF_6^-$, $AsF_6^-$, $SbF_6^-$, $FeCl_4^-$, $Fe(CN)_6^{3-}$, and anions of various sulfonic acids, such as aryl-$SO_3^-$). When holes are used as carriers, examples of dopants are cations (e.g., $H^+$, $Li^+$, $Na^+$, $K^+$, $Rb^+$ and $Cs^+$, alkali metals (e.g., Li, Na, K, Rb, and Cs), alkaline-earth metals (e.g., Ca, Sr, and Ba), $C_2$, $XeOF_4$, $(NO_2^+)(SbF_6^-)$, $(NO_2^+)(SbCl_6^-)$, $(NO_2^+)(BF_4^-)$, $AgClO_4$, $H_2IrCl_6$, $La(NO_3)_3.6H_2O$, $FSO_2OSO_2F$, Eu, acetylcholine, $R_4N^+$, (R is an alkyl group), $R_4P^+$ (R is an alkyl group), $R_6As^+$ (R is an alkyl group), and $R_3S^+$ (R is an alkyl group).

The conducting form of the compounds of the present invention can be used as an organic "metal" in applications including, but not limited to, charge injection layers and ITO planarising layers in OLED applications, films for flat panel displays and touch screens, antistatic films, printed conductive substrates, patterns or tracts in electronic applications such as printed circuit boards and condensers.

The compounds and formulations according to the present invention amy also be suitable for use in organic plasmon-emitting diodes (OPEDs), as described for example in Koller et al., Nature Photonics 2008 (published online Sep. 28, 2008).

According to another use, the materials according to the present invention can be used alone or together with other materials in or as alignment layers in LCD or OLED devices, as described for example in US 2003/0021913. The use of charge transport compounds according to the present invention can increase the electrical conductivity of the alignment layer. When used in an LCD, this increased electrical conductivity can reduce adverse residual dc effects in the switchable LCD cell and suppress image sticking or, for example in ferroelectric LCDs, reduce the residual charge produced by the switching of the spontaneous polarisation charge of the ferroelectric LCs. When used in an OLED device comprising a light emitting material provided onto the alignment layer, this increased electrical conductivity can enhance the electroluminescence of the light emitting material. The compounds or materials according to the present invention having mesogenic or liquid crystalline properties can form oriented anisotropic films as described above, which are especially useful as alignment layers to induce or enhance alignment in a liquid crystal medium provided onto said anisotropic film. The materials according to the present invention may also be combined with photoisomerisable compounds and/or chromophores for use in or as photoalignment layers, as described in US 2003/0021913.

According to another use the materials according to the present invention, especially their water-soluble derivatives (for example with polar or ionic side groups) or ionically doped forms, can be employed as chemical sensors or materials for detecting and discriminating DNA sequences. Such uses are described for example in L. Chen, D. W. McBranch, H. Wang, R. Helgeson, F. Wudl and D. G. Whitten, Proc. Natl. Acad. Sci. U.S.A. 1999, 96, 12287; D. Wang, X. Gong, P. S. Heeger, F. Rininsland, G. C. Bazan and A. J. Heeger, Proc. Natl. Acad. Sci. U.S.A. 2002, 99, 49; N. DiCesare, M. R. Pinot, K. S. Schanze and J. R. Lakowicz, Langmuir 2002, 18, 7785; D. T. McQuade, A. E. Pullen, T. M. Swager, Chem. Rev. 2000, 100, 2537.

Unless the context clearly indicates otherwise, as used herein plural forms of the terms herein are to be construed as including the singular form and vice versa.

Throughout the description and claims of this specification, the words "comprise" and "contain" and variations of the words, for example "comprising" and "comprises", mean "including but not limited to", and are not intended to (and do not) exclude other components.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

It will be appreciated that many of the features described above, particularly of the preferred embodiments, are inventive in their own right and not just as part of an embodiment of the present invention. Independent protection may be sought for these features in addition to or alternative to any invention presently claimed.

REFERENCES (1) Blouin, N.; Leclerc, M. *Acc. Chem. Res.* 2008, 41, 1110-1119.
(2) Morin, J.-F.; Leclerc, M.; Ades, D.; Siove, A. *Macromol. Rapid Commun.* 2005, 26, 761-778.
(3) Cho, S. H.; Song, K. T.; Lee, J. Y. In *Handbook of Conducting Polymers;* Skotheim, T. A., Reynolds, J. R., Eds.; CRC Press LLC: Boca Raton, Fla., 2007; Vol. 1, p 8/1-8/87.
(4) Boudreault, P.-L.; Blouin, N.; Leclerc, M. *Adv. Polym. Sci.* 2008, 212, 99-124.
(5) Grazulevicius, J. V.; Strohriegl, P.; Pielichowski, J.; Pielichowski, K. *Prog. Polym. Sci.* 2003, 28, 1297-1353.
(6) Morin, J. F.; Leclerc, M. *Macromolecules* 2001, 34, 4680-4682.
(7) Kim, J.; Park, S. H.; Cho, S.; Jin, Y.; Kim, J.; Kim, I.; Lee, J. S.; Kim, J. H.; Woo, H. Y.; Lee, K.; Suh, H. *Polymer* 2010, 51, 390-396.
(8) U.S. Pat. No. 7,309,532 B2
(9) Sirringhaus, H.; Brown, P. J.; Friend, R. H.; Nielsen, M. M.; Bechgaard, K.; Langeveld-Voss, B. M. W.; Spiering, A. J. H.; Janssen, R. A. J.; Meijer, E. W.; Herwig, P.; de Leeuw, D. M. *Nature* 1999, 401, 685-688.
(10) Scherf, U.; List, E. J. W. *Adv. Mater.* 2002, 14, 477-487.
(11) Yamamoto, T.; Morita, A.; Miyazaki, Y.; Maruyama, T.; Wakayama, H.; Zhou, Z. H.; Nakamura, Y.; Kanbara, T.; Sasaki, S.; Kubota, K. *Macromolecules* 1992, 25, 1214-1223.
(12) Yamamoto, T.; Takimiya, K. *J. Am. Chem. Soc.* 2007, 129, 2224-2225.
(13) Schluter, A. D. *J. Polym. Sci., Part A: Polym. Chem.* 2001, 39, 1533-1556.
(14) Bao, Z.; Chan, W. K.; Yu, L. *J. Am. Chem. Soc.* 1995, 117, 12426-12435.
(15) Mullekom, H. A. M. v.; Vekemans, J. A. J. M.; Havinga, E. E.; Meijer, E. W. *Mater. Sci. Eng., R.* 2001, 32, 1-40.
(16) Dennler, G.; Scharber, M. C.; Brabec, C. J. *Adv. Mater.* 2009, 21, 1323-1338.

The invention will now be described in more detail by reference to the following examples, which are illustrative only and do not limit the scope of the invention.

EXAMPLE 1

1.1 2,7-Dibromo-4-nitro-9,10-dihydro-phenanthrene

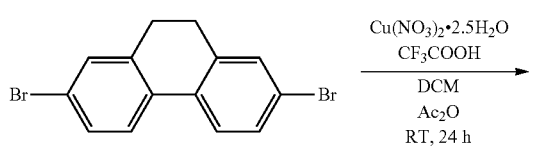

$$\xrightarrow{\substack{Cu(NO_3)_2 \cdot 2.5H_2O \\ CF_3COOH \\ DCM \\ Ac_2O \\ RT, 24\ h}}$$

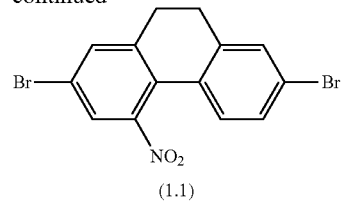

(1.1)

To a mixture of 2,7-dibromo-9,10-dihydro-phenanthrene (50.90 g, 150.6 mmol), ground in fine powder, in dichloromethane (1500 cm$^3$) and acetic anhydrous (355 cm$^3$) was added copper nitrate hemipentahydrate (36.77 g, 158.1 mmol), ground in fine powder, and finally trifluoacetic acid (55.9 cm$^3$, 753 mmol) was added slowly. The reaction mixture was stirred for 16 hours and then poured into water (750 cm$^3$). The organic phase was separated and further washed with water (3×750 cm$^3$) before been dried over magnesium sulfate. The solvent was removed in vacuo and the crude product triturated into methanol (45.83 g, yield 79.5%): NMR ($^1$H, 300 MHz, CDCl$_3$): δ 7.69 (d, J=2.0 Hz, 1H); 7.59 (d, J=2.0 Hz, 1H); 7.45 (d, J=2.0 Hz, 1H); 7.35 (dd, J$_1$=8.4 Hz, J$_2$=2.1 Hz, 1H); 7.10 (d, J=8.4 Hz, 1H); 2.82 (s, 4H).

1.2
2,6-Dibromo-8,9-dihydro-4H-benzo[def]carbazole

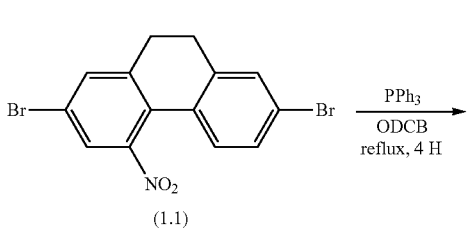

(1.1)

$$\xrightarrow{\substack{PPh_3 \\ ODCB \\ reflux, 4\ H}}$$

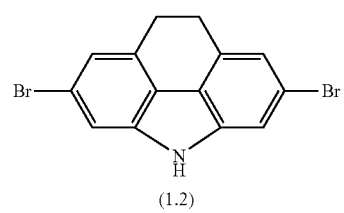

(1.2)

A dried flask fitted with a condenser was charged with 2,7-dibromo-4-nitro-9,10-dihydro-phenanthrene (1.1) (45.00 g, 383.0 mmol), triphenylphosphine (77.04 g, 262.3 mmol) and 1,2-dichlorobenzene (235 cm$^3$). The resulting mixture was refluxed for 4 hours until completion of reaction, then was cooled down and the solvent was removed in vacuo. The crude product was purified by column chromatography (gradient, 90:10 to 70:30; petroleum ether:ethyl acetate as eluent) and then recrystallized in a mixture of petroleum ether (80-100° C.) and toluene (ca. 1:1). (24.03 g, yield 57.2%):

NMR (¹H, 300 MHz, DMSO): δ 11.09 (s, 1H), 7.46 (d, J=0.9 Hz, 2H), 7.12 (d, J=0.9 Hz, 2H), 3.25 (s, 4H).

1.3 N-(1-octyl-nonyl)-2,6-Dibromo-8,9-dihydro-benzo[def]carbazole

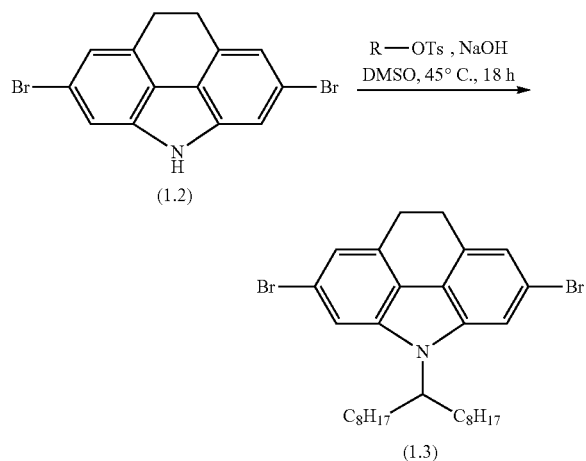

(R=1-octyl-nonyl)

A dried three neck flask fitted with an addition funnel was charged with 2,6-dibromo-8,9-dihydro-4H-benzo[def]carbazole (1.2) (3.50 g, 9.97 mmol), dimethyl sulfoxide (60 cm³) and freshly powdered potassium hydroxide (2.80 g, 56.1 mmol). The resulting solution is heated to 45° C. before adding toluene-4-sulfonic acid 1-octyl-nonyl ester (initial 4.28 g, then portionwise 1.00 g every 30 minutes up to 12.32 g (29.91 mmol) in total). After 18 hours, the reaction was poured into distilled water (100 cm³) and the aqueous layer was extracted three times with petroleum ether (3×150 mL). The combined organic fractions were dried over magnesium sulfate and the solvent was removed under reduced pressure. The crude product was dissolved in dichloromethane, pre-adsorbed on silica gel, and purified by column chromatography (gradient, 100:0 to 80:20 petroleum ether:ethyl acetate as eluent) resulting in a off-white solid. (3.73 g, yield 63.5%): NMR (¹H, 300 MHz, CDCl₃): δ 7.34 (s, 2H); 7.11 (s, 2H); 4.24 (m, 1H); 3.28 (s, 4H); 2.11 (m, 2H), 1.86 (m, 2H); 1.21 (m, 24H); 0.83 (t, J=7.0 Hz, 6H).

1.4 N-(1-Octyl-nonyl)-2,6-bis-(4,4,5,5-tetramethyl-[1,3,2]dioxaborolan-2-yl)-8,9-dihydro-benzo[def]carbazole

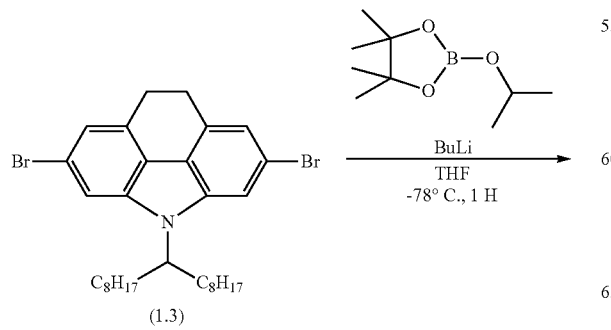

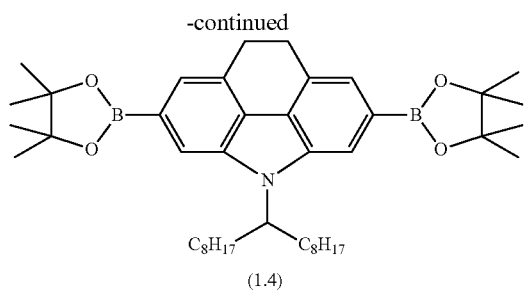

A dried round bottom flaks was charged with N-(1-octyl-nonyl)-2,6-dibromo-8,9-dihydro-benzo[def]carbazole (1.3) (3.600 g, 6.107 mmol) and tetrahydrofuran (60 cm³). The resulting solution was cooled down to −78° C., then n-butyl-lithium (2.5M in hexanes, 5.00 cm³, 12.52 mmol) was added dropwise over 10-15 minutes. The mixture was stirred at −78° C. for 30 minutes, then 2-isopropoxy-4,4,5,5-tetramethyl-1,3,2-dioxaborolane (2.74 cm³ 13.44 mmol) was added rapidly to the solution. After an additional 1 hour at −78° C., the resulting mixture was warmed to room temperature and stirred for 2 hours. The mixture was then poured into water, extracted with diethyl ether four times and dried over magnesium sulfate. The solvent was removed under reduced pressure, and the residue was purified by recrystallisation from methanol:acetone (ca. 3:1) to obtain the title product as a off-white crystalline solid (2.99 g, yield 71.6%): NMR (¹H, 300 MHz, CDCl₃): δ 7.69 (s, 2H); 7.46 (s, 2H); 4.50 (m, 1H); 3.34 (s, 4H); 2.26(m, 2H), 1.92 (m, 2H); 1.38 (s, 24H), 1.21 (m, 24H); 0.82 (t, J=6.8 Hz, 6H).

1.5 Poly[2,6-(N-(1-Octyl-nonyl)-8,9-dihydro-benzo[def]carbazole)-alt-5,5-(4,7-di-2'-thienyl-2,1,3-benzothiadiazole)]

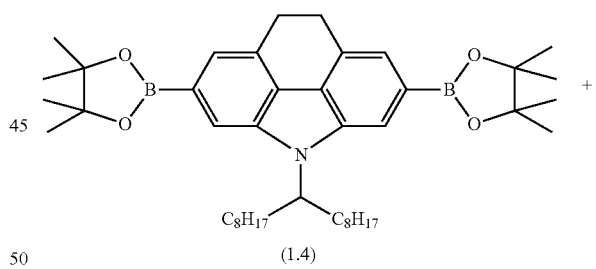

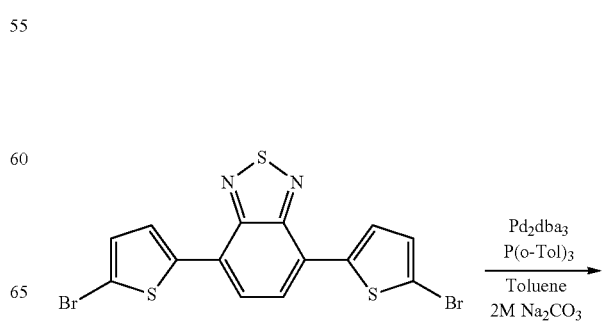

-continued

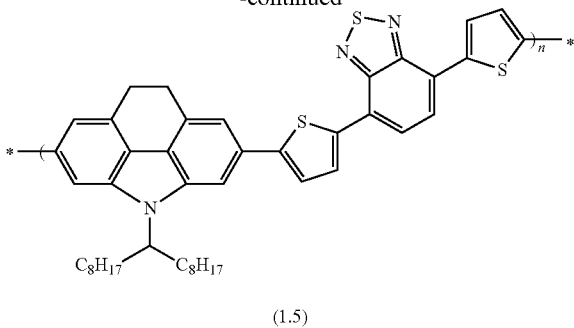

(1.5)

The synthesis of the comonomer 4,7-di(2'-bromothien-5'-yl)-2,1,3-benzothiadiazole monomer is described in the literature, for example in WO 2000/046321 A1.

In a dried flask, N-(1-Octyl-nonyl)-2,6-bis-(4,4,5,5-tetramethyl-[1,3,2]dioxaborolan-2-yl)-8,9-dihydro-benzo[def] carbazole (1.4) (546.9 mg, 0.8000 mmol), 4,7-di(2'-bromothien-5'-yl)-2,1,3-benzothiadiazole (366.6 mg, 0.8000 mmol), tris(dibenzylideneacetone)dipalladium(0) (3.7 mg, 0.0040 mmol), tri(o-tolyl)phosphine (4.9 mg, 0.0160 mmol) and Aliquat 336 (100 mg) were dissolved in degassed toluene (8.0 cm$^3$) and degassed aqueous 2.0 M potassium carbonate (3.2 cm$^3$). The reaction mixture was vigorously stirred at 100-105° C. for 21 hours. The polymer was purified by precipitation into methanol:water (10:1), filtered and washed sequentially via Soxhlet extraction with acetone, petroleum ether (80-100° C.), and chloroform. The chloroform fraction was reduced to a smaller volume in vacuo and precipitated into methanol (500 cm$^3$). The precipitated polymer was filtered and dried under vacuum at 25° C. overnight to afford the title product (322 mg, yield 55%): $M_n$=8.0 kg.mol$^{-1}$, $M_w$=13.5 kg.mol$^{-1}$. $\lambda_{max}$=573 nm (solid state), 553 nm (chlorobenzene).

EXAMPLE 1B

Bulk heterojunction organic photovoltaic devices (OPVs) are fabricated according to the following procedure.

Patterned indium tin oxide (ITO) coated glass substrates (Luminescence Technology Corp.) are used as a transparent bottom electrode. PEDOT:PSS (Clevios PVP AI4083, H.C.Stark) is blade coated from an aqueous solution onto the substrates and dried at 130° C. on a hotplate for 30 minutes. The resulting polymer layer is approximately 40 nm thickness. Solutions containing polymer (1.5) of Example 1A and PC$_{61}$BM (6,6-phenyl C61 butyric acid methyl ester, from Solenne BV) at a total solid concentration of 23 mg.cm$^{-3}$ in o-dichlorobenzene and containing an additional 3% of diiodooctane are prepared; the active material ratio in the blend is 1:3 polymer (1.5) to PC$_{61}$BM. The blend is deposited by blade coating onto PEDOT:PSS layer and dried for 2 minutes at 70° C. The active layer thickness is about 140 nm. Devices are completed by depositing a top electrode material, Calcium (30 nm)/Aluminium (200 nm), by sequential thermal evaporation through a shadow mask. Current-voltage characteristics were measured using a Keithley 2400 SMU while the solar cells were illuminated by a Newport Solar Simulator at 100 mW.cm$^{-2}$ white light. The solar simulator was equipped with AM1.5G filters. The illumination intensity was calibrated using a Si photodiode. All the device preparation and characterisation is done in a dry-nitrogren atmosphere.

Power conversion efficiency is calculated using the following expression $$\eta = V_{oc} \times J_{sc} \times FF/P_{in}$$

where FF is defined as $$FF = V_{max} \times J_{max}/V_{oc} \times J_{sc}$$

The following device performance was obtained.
$V_{oc}$=730 mV, $J_{sc}$=−6.38 mA, FF=0.44, $\eta$=2.1%.

The current density versus voltage of the device is shown in FIG. 1.

EXAMPLE 2A

2.1 N-Octyl-2,6-dibromo-8,9-dihydro-4H-benzo[def] carbazole

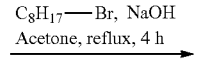

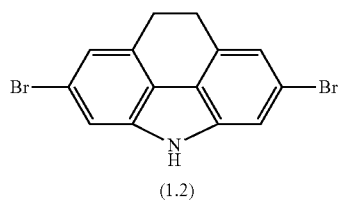

(1.2)

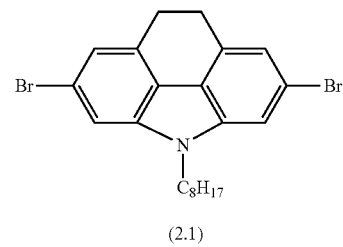

(2.1)

A dried flask fitted with a condenser was charged with 2,6-dibromo-8,9-dihydro-4H-benzo[def]carbazole (1.2) (3.50 g, 9.97 mmol), bromooctane (1.9 cm$^3$, 11.0 mmol), tetrabutylammonium bromide (0.161 g, 0.500 mmol), freshly powdered sodium hydroxide (0.798 g, 19.9 mmol) and acetone (100 cm$^3$). The resulting solution was reflux for 4 hours and then poured into distilled water (100 cm$^3$). The resulting solution was extracted with dichloromethane (3×200 cm$^3$). The combined organic fractions were dried over magnesium sulfate and the solvent was removed under reduced pressure. The crude product was dissolved in dichloromethane, pre-adsorbed on silica gel, and purified by column chromatography (90:10 petroleum ether:ethyl acetate as eluent) resulting in a off-white solid. (3.29 g, yield 71.2%):

NMR ($^1$H, 300 MHz, CDCl$_3$): δ 7.26 (s, 2H); 7.08 (s, 2H); 4.06(t, J=7.1 Hz, 2H); 3.22 (s, 4H); 1.81 (m, 4H); 1.28 (m, 10H); 0.86 (t, J=6.8 Hz, 3H).

2.2 N-(1-Octyl-nonyl)-2,6-bis-(4,4,5,5-tetramethyl[1,3,2]dioxaborolan-2-yl)-8,9-dihydro-benzo[def]carbazole

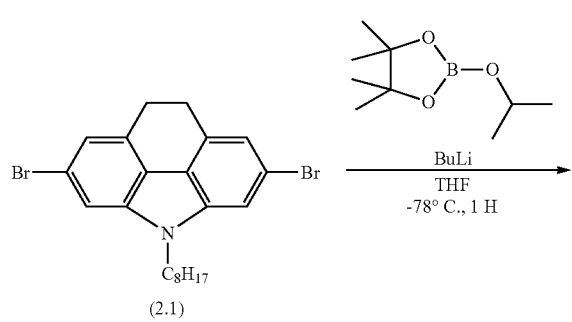

A dried round bottom flaks was charged with N-Octyl-2,6-dibromo-8,9-dihydro-4H-benzo[def]carbazole (2.1) (2.800 g, 6.044 mmol) and tetrahydrofuran (60 cm$^3$). The resulting solution was cooled down to −78° C., then n-butyllithium (2.5M in hexanes, 4.95 cm$^3$, 12.39 mmol) was added dropwise over 10-15 minutes. The mixture was stirred at −78° C. for 30 minutes, then 2-isopropoxy-4,4,5,5-tetramethyl-1,3,2-dioxaborolane (2.71 cm$^3$, 13.30 mmol) was added rapidly to the solution. After an additional 1 hour at −78° C., the resulting mixture was warmed to room temperature and stirred for 2 hours. The mixture was then poured into water, extracted with diethyl ether four times and dried over magnesium sulfate. The solvent was removed under reduced pressure, and the residue was purified by column chromatography (gradient, 98:2 to 90:10, petroleum ether:ethyl acetate with 2% triethylamine as eluent) followed by recrystallisation from methanol:acetone (ca. 3:1) to obtain the title product as a off-white crystalline solid (0.899 g, yield 26.7%): NMR ($^1$H, 300 MHz, CDCl$_3$): δ 7.66 (s, 2H); 7.47 (s, 2H); 4.29 (t, J=7.3 Hz, 2H); 3.34 (s, 4H); 1.90 (m, 4H); 1.38 (s, 24H), 1.25 (m, 10H); 0.82 (t, J=6.7 Hz, 3H).

2.3 Poly[2,6-(N-Octyl-8,9-dihydro-benzo[def]carbazole)-alt-5,5-(4,7-di-2'-thienyl-5,6-bis-octyloxyl-2,1,3-benzothiadiazole)] (2)

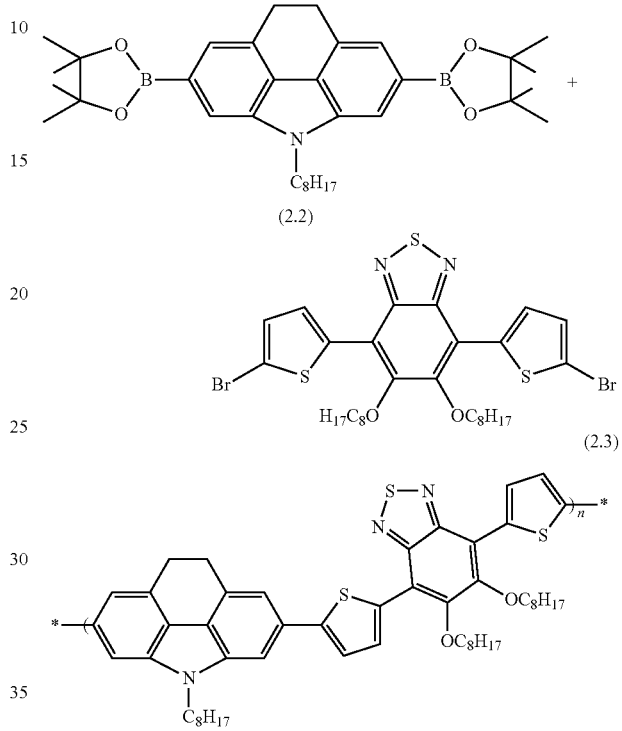

The synthesis of the comonomer 4,7-di(2'-bromothien-5'-yl)-5,6-bis-octyloxyl-2,1,3-benzothiadiazole is described in the literature, for example in Qin, R.; Li, W.; Li, C.; Du, C.; Veit, C.; Schleiermacher, H.-F.; Andersson, M.; Bo, Z.; Liu, Z.; Inganas, O.; Wuerfel, U.; Zhang, F. *J. Am. Chem. Soc.* 2009, 131, 14612-14613.

In a dried flask, N-(1-Octyl-nonyl)-2,6-bis-(4,4,5,5-tetramethyl-[1,3,2]dioxaborolan-2-yl)-8,9-dihydro-benzo[def]carbazole (2.2) (431.9 mg, 0.7740 mmol), 4,7-di(2'-bromothien-5'-yl)-5,6-bis-octyloxyl-2,1,3-benzothiadiazole (553.1 mg, 0.7740 mmol), tris(dibenzylideneacetone)dipalladium(0) (3.5 mg, 0.0038 mmol), tri(o-tolyl)phosphine (4.7 mg, 0.0155 mmol) and Aliquat 336 (100 mg) were dissolved in degassed toluene (8.0 cm$^3$) and degassed aqueous 2.0 M potassium carbonate (3.1 cm$^3$). The reaction mixture was vigorously stirred at 100-105° C. for 21 hours. The polymer was purified by precipitation into methanol:water (10:1), filtered and washed sequentially via Soxhlet extraction with acetone, petroleum ether (80-100° C.), and chloroform. The chloroform fraction was reduced to a smaller volume in vacuo and precipitated into methanol (500 cm$^3$). The precipitated polymer was filtered and dried under vacuum at 25° C. overnight to afford the title product (604 mg, yield 91%): $M_n$=36.7 kg.mol$^{-1}$, $M_w$=141.1kg.mol$^{-1}$. $\lambda_{max}$=565 nm (solid state), 542 nm (chlorobenzene).

EXAMPLE 2B

Bulk heterojunction organic photovoltaic devices (OPVs) are fabricated according to the following procedure.

Patterned indium tin oxide (ITO) coated glass substrates (Luminescence Technology Corp.) are used as a transparent bottom electrode. PEDOT:PSS (Clevios PVP AI4083, H.C.Stark) is blade coated from an aqueous solution onto the substrates and dried at 130° C. on a hotplate for 30 minutes. The resulting polymer layer is approximately 40 nm thickness. Solutions containing polymer (2.3) of Example 2A and PC$_{61}$BM (6,6-phenyl C61 butyric acid methyl ester, Solenne BV) at a total solid concentration of 23 mg.cm$^{-3}$ in o-dichlorobenzene and containing an additional 3% of diiodooctane are prepared; the active material ratio in the blend is 1:2 polymer (2.3) to PC$_{61}$BM. The blend is deposited by spin coating at 1000 rpm for 80 seconds onto PEDOT:PSS layer and dried for 2 minutes at 70° C. The active layer thickness is about 120 nm. Devices are completed by depositing a top electrode material, Calcium (30 nm)/Aluminium (200 nm), by sequential thermal evaporation through a shadow mask. Current-voltage characteristics were measured using a Keithley 2400 SMU while the solar cells were illuminated by a Newport Solar Simulator at 100 mW.cm$^{-2}$ white light. The Solar Simulator was equipped with AM1.5G filters. The illumination intensity was calibrated using a Si photodiode. All the device preparation and characterisation is done in a dry-nitrogren atmosphere.

Power conversion efficiency is calculated using the following expression $$\eta = V_{oc} \times J_{sc} \times FF/P_{in}$$

where FF is defined as $$FF = V_{max} \times J_{max} / V_{oc} \times J_{sc}$$

The following device performance is obtained.
$V_{oc}$=720 mV, $J_{sc}$=−5.11 mA, FF=0.34, $\eta$=1.72%.

Figure 2:
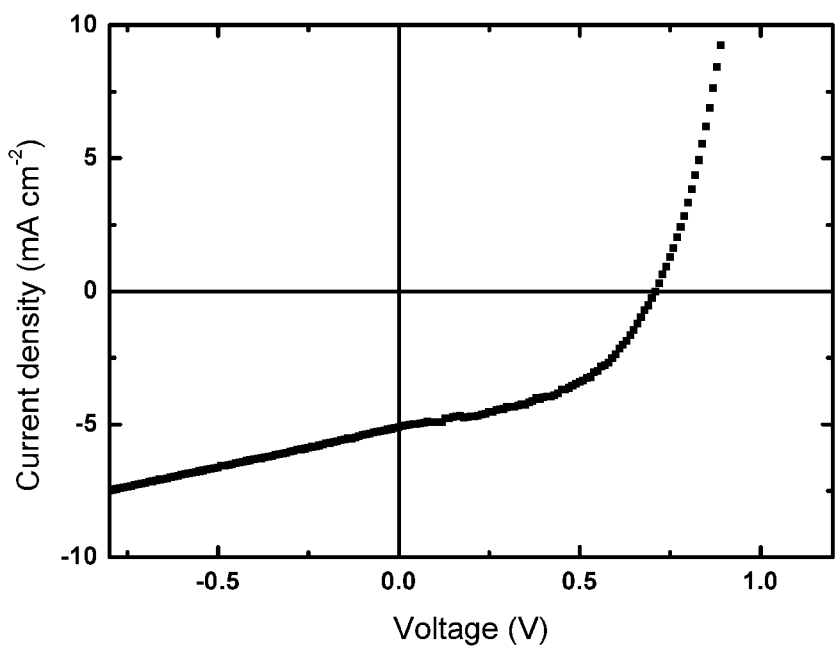
FIG. 2 shows the current density versus voltage of a bulk heterojunction OPV device according to Example 4.

The current density versus voltage of the device is shown in FIG. 2.

The invention claimed is:

1. A polymer of formula I

   I wherein

A is on each occurrence identically or differently a group of formula II

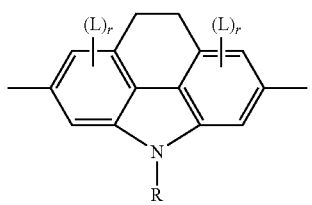   II

R is on each occurrence identically or differently H, halogen, a straight-chain, branched or cyclic alkyl with 1 to 35 C atoms, in which one or more non-adjacent C atoms are optionally replaced by —O—, —S—, —CO—, —CO—O—, —O—CO—, —O—CO—O—, —CR$^0$=CR$^{00}$— or —C≡C— and in which one or more H atoms are optionally replaced by F, Cl, Br, I or CN, or R is an aryl, heteroaryl, aryloxy or heteroaryloxy group having 2 to 40 C atoms, and R is optionally substituted by one or more non-aromatic groups R$^1$, R$^0$ and R$^{00}$ are independently of each other H or an optionally substituted carbyl or hydrocarbyl group optionally comprising one or more hetero atoms, Ar is on each occurrence identically or differently —CY$^1$=CY$^2$—, —C≡C— or an aryl or heteroaryl group that is optionally substituted by one or more groups R or R$^1$, Y$^1$ and Y$^2$ are independently of each other H, F, Cl or CN, R$^1$ is on each occurrence identically or differently H, halogen, —CN, —NC, —NCO, —NCS, —OCN, —SCN, —C(=O)NR$^0$R$^{00}$, —C(=O)X$^0$, —C(=O)R$^0$, —NH$_2$, —NR$^0$R$^{00}$, —SH, —SR$^0$, —SO$_3$H, —SO$_2$R$^0$, —OH, —NO$_2$, —CF$_3$, —SF$_5$, optionally substituted silyl, carbyl or hydrocarbyl with 1 to 40 C atoms that is optionally substituted and optionally comprises one or more hetero atoms, or P-Sp-, P is a polymerizable group, Sp is a spacer group or a single bond, X$^0$ is halogen, L has on each occurrence identically or differently one of the meanings given for R or R$^1$, r is 0, 1 or 2, x is on each occurrence identically or differently 0 or 1, wherein in at least one repeating unit [(A)$_x$-(Ar)$_y$] x is 1, y is on each occurrence identically or differently 0 or 1, n is an integer >1.

2. The polymer according to claim 1, of formula Ia

   IIa wherein A, Ar, n, x and y have the meanings of claim 1, and

R$^2$ and R$^3$ have independently of each other one of the meanings of R$^1$ in claim 1, or denote H, —CH$_2$Cl, —CHO, —CH=CH$_2$, —SiR'R"R'", —SnR'R"R'", —BR'R", —B(OR')(OR"), —B(OH)$_2$, or P-Sp, wherein P and Sp are as defined above, and R', R" and R'" have independently of each other one of the meanings of R$^0$ in claim 1, and R' and R" may also form a ring together with the hetero atom to which they are attached.

3. The polymer according to claim 1, wherein R is H or denotes primary alkyl or alkoxy with 1 to 30 C atoms, secondary alkyl or alkoxy with 3 to 30 C atoms, or tertiary alkyl or alkoxy with 4 to 30 C atoms, wherein in all these groups one or more H atoms are optionally replaced by F.

4. The polymer according to claim 1 or 2, wherein R is —CO—R$^y$, —CO—O—R$^y$, or —O—CO—R$^y$, wherein R$^y$ is straight-chain, branched or cyclic alkyl with 1 to 30 C atoms, in which one or more non-adjacent C atoms are optionally replaced by —O—, —S—, —CO—, —CO—O—, —O—CO—, —O—CO—O—, —CR$^0$=CR$^{00}$— or —C≡C— and in which one or more H atoms are optionally replaced by F, Cl, Br, I or CN, or R$^y$ is aryl or heteroaryl having 2 to 30 C atoms that is unsubstituted or substituted by one or more non-aromatic groups R$^1$ as defined in claim 1.

5. The polymer according to claim 1, wherein Ar is a unit of formula III

   III wherein Ar$^1$ and Ar$^2$ are independently of each other of the following formulae or their mirror images

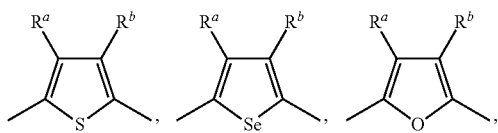

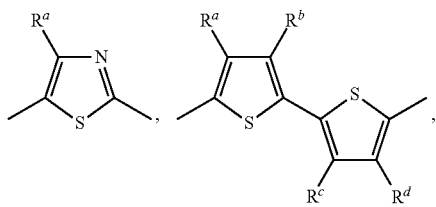

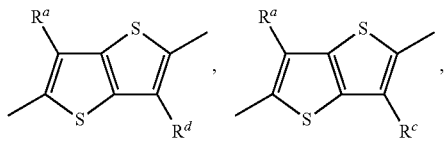

and one of Ar¹ and Ar² may also be a single bond,

Ar³ is thieno[3,2-b]thiophene-2,5-diyl, thieno[2,3-b]thiophene-2,5-diyl, selenopheno[3,2-b]selenophene-2,5-diyl, selenopheno[2,3-b]selenophene-2,5-diyl, selenopheno[3,2-b]thiophene-2,5-diyl, selenopheno[2,3-b]thiophene-2,5-diyl, benzo[1,2-b:4,5-b']dithiophene-2,6-diyl, dithieno[3,2-b:2',3'-d]silole-5,5-diyl, 4H-cyclopenta[2,1-b:3,4-b']dithiophene-2,6-diyl, carbazole-2,7-diyl, fluorene-2,7-diyl, indaceno[1,2-b:5,6-b']dithiophene-2,7-diyl, benzo[1",2":4,5;4",5":4',5']bis(silolo[3,2-b:3',2'-b']thiophene)-2,7-diyl, indaceno[1,2-b:5,6-b']dithiophene-2,7-diyl, phenanthro[1,10,9,8-c,d,e,f,g]carbazole-2,7-diyl, benzo[2,1,3]thiadiazole-4,7-diyl, benzo[2,1,3]selenadiazole-4,7-diyl, benzo[2,1,3]oxadiazole-4,7-diyl, 2H-benzotriazole-4,7-diyl, thieno[3,4-b]pyrazine-2,5-diyl, quinoxaline-5,8-diyl, thieno[3,4-b]thiophene-4,6-diyl, thieno[3,4-b]thiophene-6,4-diyl, pyrrolo[3,4-c]pyrrole-1,4-dione-3,6-diyl, [1,3]thiazolo[5,4-d][1,3]thiazole-2,5-diyl, thieno[2,1,3]thiadiazole-2,5-diyl, 2-thia-1,3,5,8-tetraaza-cyclopenta[b]naphthalene-4,9-diyl, or thieno[3,4-c]pyrrole-4,6-dione-1,3-diyl, all of which are unsubstituted, or mono- or polysubstituted with R as defined in claim 1, $R^{a-d}$ have one of the meanings given for $R^1$ in claim 1.

6. The polymer according to claim 5, wherein R is alkyl, alkoxy, thioalkyl, fluorinated alkyl or fluorinated alkoxy with 1 to 20 C atoms.

7. The polymer according to claim 5, wherein:
(a) $R^{a-d}$ are alkyl, alkoxy, thioalkyl fluorinated alkyl or fluorinated alkoxy with 1 to 20 C atoms,
(b) $R^a$ and $R^d$ have the same meaning and/or $R^b$ and $R^c$ have the same meaning,
(c) $R^a$ and $R^d$ denote H and $R^b$ and $R^c$ are different from H, or
(d) $R^b$ and $R^c$ denote H and $R^a$ and $R^d$ are different from H.

8. The polymer according to claim 5, wherein the unit of formula III is of formula IIIa

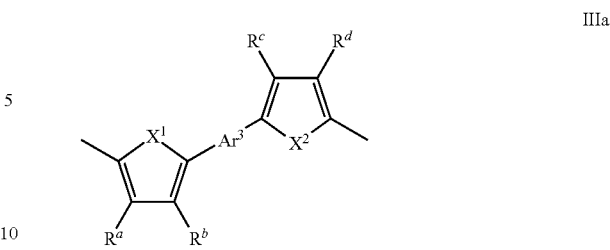

wherein Ar³, $R^a$, $R^b$, $R^c$ and $R^d$ are as defined in claim 5, and $X^1$, $X^2$ denote independently of each other O, S or Se.

9. The polymer according to claim 8, wherein $X^1$ and $X^2$ are the same.

10. The polymer according to claim 8, wherein $X^1$ and $X^2$ are both S.

11. The polymer according to claim 1, wherein Ar is selenophene-2,5-diyl, thiophene-2,5-diyl, thieno[3,2-b]thiophene-2,5-diyl, thieno[2,3-b]thiophene-2,5-diyl, selenopheno[3,2-b]selenophene-2,5-diyl, selenopheno[2,3-b]selenophene-2,5-diyl, selenopheno[3,2-b]thiophene-2,5-diyl, selenopheno[2,3-b]thiophene-2,5-diyl, benzo[1,2-b:4,5-b']dithiophene-2,6-diyl, 2,2-dithiophene, 2,2-diselenophene, dithieno[3,2-b:2',3'-d]silole-5,5-diyl, 4H-cyclopenta[2,1-b:3,4-b']dithiophene-2,6-diyl, 2,7-di-thien-2-yl-carbazole, 2,7-di-thien-2-yl-fluorene, indaceno[1,2-b:5,6-b']dithiophene-2,7-diyl, benzo[1",2":4,5;4",5":4',5']bis(silolo[3,2-b:3',2'-b']thiophene)-2,7-diyl, 2,7-di-thien-2-yl-indaceno[1,2-b:5,6-b']dithiophene, 2,7-di-thien-2-yl-benzo[1",2":4,5;4",5":4',5']bis(silolo[3,2-b:3',2'-b']thiophene)-2,7-diyl, 2,7-di-thien-2-yl-phenanthro[1,10,9,8-c,d,e,f,g]carbazole, 4,7-di-thien-2-yl-benzo[2,1,3]thiadiazole, 4,7-di-thien-2-yl-benzo[2,1,3]selenadiazole, 4,7-di-thien-2-yl-benzo[2,1,3]oxadiazole, 4,7-di-thien-2-yl-2H-benzotriazole, 3,4-difluorothiophene-2,5-diyl, thieno[3,4-b]pyrazine-2,5-diyl, 2,5-di-thien-2-yl-thieno[3,4-b]pyrazine, 5,8-di-thien-2-yl-quinoxaline, thieno[3,4-b]thiophene-4,6-diyl, 4,6-di-thien-2-yl-thieno[3,4-b]thiophene, thieno[3,4-b]thiophene-6,4-diyl, 6,4-di-thien-2-yl-thieno[3,4-b]thiophene, 3,6-di-thien-2-yl-pyrrolo[3,4-c]pyrrole-1,4-dione, 2,5-di-thien-2-yl-[1,3]thiazolo[5,4-d][1,3]thiazole, thieno[2,1,3]thiadiazole-2,5-diyl, 2,5-di-thien-2-yl-thieno[2,1,3]thiadiazole, 4,9-di-thien-2-yl-2-thia-1,3,5,8-tetraaza-cyclopenta[b]naphthalene, thieno[3,4-c]pyrrole-4,6-dione-1,3-diyl,1,3-dithien-2-yl-thieno[3,4-c]pyrrole-4,6-dione, all of which are unsubstituted, or mono- or polysubstituted with R or $R^1$ as defined in claim 1.

12. The polymer according to claim 11, wherein $R^1$ is alkyl, alkoxy, thioalkyl, fluorinated alkyl or fluorinated alkoxy with 1 to 20 C atoms.

13. A polymer blend comprising one or more polymers according to claim 1 and one or more additional polymers, wherein these additional polymers polymers having semiconducting, charge transport, hole/electron transport, hole/electron blocking, electrically conducting, photoconducting or light emitting properties.

14. A formulation comprising one or more polymers according to claim 1, and one or more solvents.

15. An optical, electrooptical, electronic, electroluminescent or photoluminescent component or device, comprising a charge transport, semiconducting, electrically conducting, photoconducting or light emitting material that is a polymer according to claim 1.

16. An optical, electrooptical or electronic component or device comprising one or more polymers claim 1.

17. The component or device according to claim 16, that is organic field effect transistors (OFET), thin film transistors (TFT), integrated circuits (IC), logic circuits, capacitors, radio frequency identification (RFID) tags, devices or components, organic light emitting diodes (OLED), organic light emitting transistors (OLET), flat panel displays, backlights of displays, organic photovoltaic devices (OPV), solar cells, laser diodes, photoconductors, photodetectors, electrophotographic devices, electrophotographic recording devices, organic memory devices, sensor devices, charge injection layers, charge transport layers or interlayers in polymer light emitting diodes (PLEDs), Schottky diodes, planarising layers, antistatic films, polymer electrolyte membranes (PEM), conducting substrates, conducting patterns, electrode materials in batteries, alignment layers, biosensors, biochips, security markings, security devices, or components or devices for detecting and discriminating DNA sequences.

18. The component or device according to claim 16, which is an OFET or a bulk heterojunction OPV device.

19. A monomer of formula IIa $$R^2\text{-}A\text{-}R^3 \qquad \text{IIa}$$

wherein A is a group of formula II

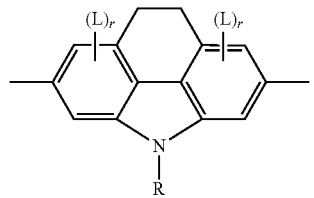

where

R is on each occurrence identically or differently H, halogen, a straight-chain, branched or cyclic alkyl with 1 to 35 C atoms, in which one or more non-adjacent C atoms are optionally replaced by —O—, —S—, —CO—, —CO—O—, —O—CO—, —O—CO—O—, —CR⁰=CR⁰⁰— or —C≡C— and in which one or more H atoms are optionally replaced by F, Cl, Br, I or CN, or R is an aryl, heteroaryl, aryloxy or heteroaryloxy group having 2 to 40 C atoms, and R is optionally substituted by one or more non-aromatic groups $R^1$, $R^0$ and $R^{00}$ are independently of each other H or an optionally substituted carbyl or hydrocarbyl group optionally comprising one or more hetero atoms, $R^1$ is on each occurrence identically or differently H, halogen, —CN, —NC, —NCO, —NCS, —OCN, —SCN, —C(=O)NR⁰R⁰⁰, —C(=O)X⁰, —C(=O)R⁰, —NH₂, —NR⁰R⁰⁰, —SH, —SR⁰, —SO₃H, —SO₂R⁰, —OH, —NO₂, —CF₃, —SF₅, optionally substituted silyl, carbyl or hydrocarbyl with 1 to 40 C atoms that is optionally substituted and optionally comprises one or more hetero atoms, or P-Sp-, P is a polymerizable group, Sp is a spacer group or a single bond, $X^0$ is halogen, L has on each occurrence identically or differently one of the meanings given for R or $R^1$, r is 0, 1 or 2, and $R^2$ and $R^3$ are each independently Cl, BR, I, O-tosylate, O-triflate, O-mesylate, O-nonaflate, —SiMe₂F, —SiMeF₂, —O—SO₂Z¹, —B(OZ²)₂, —CZ³=C(Z³)₂, —C≡CH and —Sn(Z⁴)₃, wherein $Z^{1\text{-}4}$ are alkyl or aryl, each being optionally substituted, and two groups $Z^2$ may also form a cyclic group.

20. A process of preparing a polymer according to claim 1, by coupling one or more monomers of formula IIa $$R^2\text{-}A\text{-}R^3 \qquad \text{IIa}$$

wherein A is a group of formula II

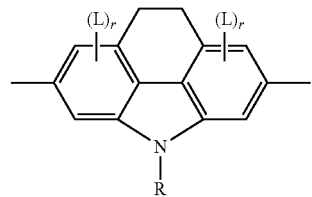

where

R is on each occurrence identically or differently H, halogen, a straight-chain, branched or cyclic alkyl with 1 to 35 C atoms, in which one or more non-adjacent C atoms are optionally replaced by —O—, —S—, —CO—, —CO—O—, —O—CO—, —O—CO—O—, —CR⁰=CR⁰⁰— or —C≡C— and in which one or more H atoms are optionally replaced by F, Cl, Br, I or CN, or R is an aryl, heteroaryl, aryloxy or heteroaryloxy group having 2 to 40 C atoms, and R is optionally substituted by one or more non-aromatic groups $R^1$, $R^0$ and $R^{00}$ are independently of each other H or an optionally substituted carbyl or hydrocarbyl group optionally comprising one or more hetero atoms, $R^1$ is on each occurrence identically or differently H, halogen, —CN, —NC, —NCO, —NCS, —OCN, —SCN, —C(=O)NR⁰R⁰⁰, —C(=O)X⁰, —C(=O)R⁰, —NH₂, —NR⁰R⁰⁰, —SH, —SR⁰, —SO₃H, —SO₂R⁰, —OH, —NO₂, —CF₃, —SF₅, optionally substituted silyl carbyl or hydrocarbyl with 1 to 40 C atoms that is optionally substituted and optionally comprises one or more hetero atoms, or P-Sp-, P is a polymerizable group, Sp is a spacer group or a single bond, $X^0$ is halogen, L has on each occurrence identically or differently one of the meanings given for R or $R^1$, r is 0, 1 or 2, and $R^2$ and $R^3$ have independently of each other one of the meanings of $R^1$ above, or denote H, —CH₂Cl, —CHO, —CH=CH₂, —SiR'R''R''', —SnR'R''R''', —BR'R'', —B(OR')(OR''), —B(OH)₂, or P-Sp, wherein P and Sp are as defined above, and R', R'' and R''' have independently of each other one of the meanings of $R^0$ above, and R' and R'' may also form a ring together with the hetero atom to which they are attached, with each other in an aryl-aryl coupling reaction.

\* \* \* \* \*